US 9,591,782 B2

(12) United States Patent
Sasaki et al.

(10) Patent No.: US 9,591,782 B2
(45) Date of Patent: Mar. 7, 2017

(54) CONNECTOR HOUSING APPARATUS AND INTER-CONNECTOR CONNECTING SYSTEM

(71) Applicant: ALAXALA NETWORKS CORPORATION, Kawasaki-shi, Kanagawa (JP)

(72) Inventors: Toru Sasaki, Kawasaki (JP); Shuuji Kameno, Kawasaki (JP); Junji Baba, Kawasaki (JP)

(73) Assignee: Alaxala Networks Corporation, Kanagawa (JP)

(*) Notice: Subject to any disclaimer, the term of this patent is extended or adjusted under 35 U.S.C. 154(b) by 0 days.

(21) Appl. No.: 15/052,073

(22) Filed: Feb. 24, 2016

(65) Prior Publication Data

US 2016/0248204 A1  Aug. 25, 2016

(30) Foreign Application Priority Data

Feb. 25, 2015  (JP) .................................. 2015-035740

(51) Int. Cl.
| | | |
|---|---|---|
| H05K 5/00 | (2006.01) | |
| H05K 7/14 | (2006.01) | |
| H05H 5/00 | (2006.01) | |

(52) U.S. Cl.
CPC ............. *H05K 7/1409* (2013.01); *H05H 5/00* (2013.01)

(58) Field of Classification Search
USPC ............ 361/729.02, 679.22, 679.32, 679.34, 361/679.38, 679.39, 679.03, 679.43, 361/679.44, 679.59, 724, 725, 730, 741, 361/752, 754, 756, 796, 801, 802; 439/571
See application file for complete search history.

(56) References Cited

U.S. PATENT DOCUMENTS

| | | | | |
|---|---|---|---|---|
| 5,199,892 A | * | 4/1993 | Campbell | ............ H01R 13/631 361/787 |
| 5,216,578 A | | 6/1993 | Zenitani et al. | |
| 6,741,463 B1 | * | 5/2004 | Akhtar | .................. G06F 1/1632 312/223.1 |

(Continued)

FOREIGN PATENT DOCUMENTS

| | | |
|---|---|---|
| JP | 04-113693 A | 4/1992 |
| JP | 2006-260541 A | 9/2006 |

*Primary Examiner* — Abdullah Riyami
*Assistant Examiner* — Harshad Patel
(74) *Attorney, Agent, or Firm* — Volpe and Koenig, P.C.

(57) ABSTRACT

A connector housing apparatus includes a main body section that has a plurality of connectors confronting a plurality of external connectors of an external housing and a moving guide section that guides movement of the main body section toward the external housing. The moving guide section has a latching section that latches the moving guide section on the external housing. The main body section is connected to the moving guide section so as to be movable in a fitting direction of the plurality of connectors. The latching section latches the moving guide section on a position at which the plurality of connectors are fitted to the plurality of external connectors. The main body section moves along the moving guide section in the fitting direction of the plurality of connectors, and thereby the plurality of connectors are fitted to the plurality of external connectors.

9 Claims, 26 Drawing Sheets

(56) References Cited

U.S. PATENT DOCUMENTS

| | | | |
|---|---|---|---|
| 2004/0057216 A1* | 3/2004 | Smith | G06F 1/3287 361/724 |
| 2008/0239689 A1* | 10/2008 | Okamoto | H05K 7/1487 361/807 |
| 2009/0016010 A1* | 1/2009 | Vinson | G11B 33/124 361/679.31 |
| 2012/0320533 A1* | 12/2012 | Zhang | H05K 7/1489 361/726 |
| 2013/0329364 A1* | 12/2013 | Kameno | H05K 7/20563 361/697 |

* cited by examiner

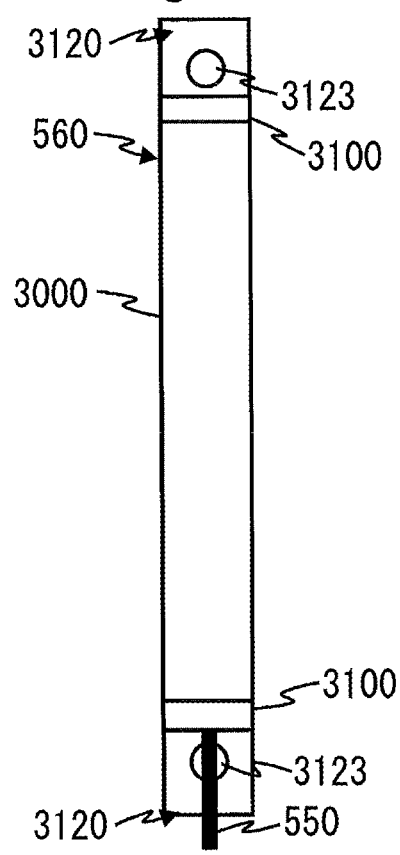

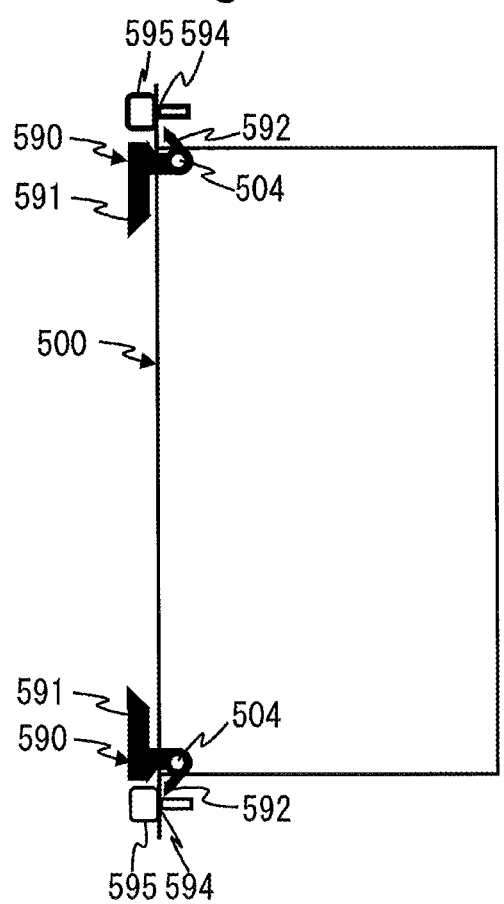

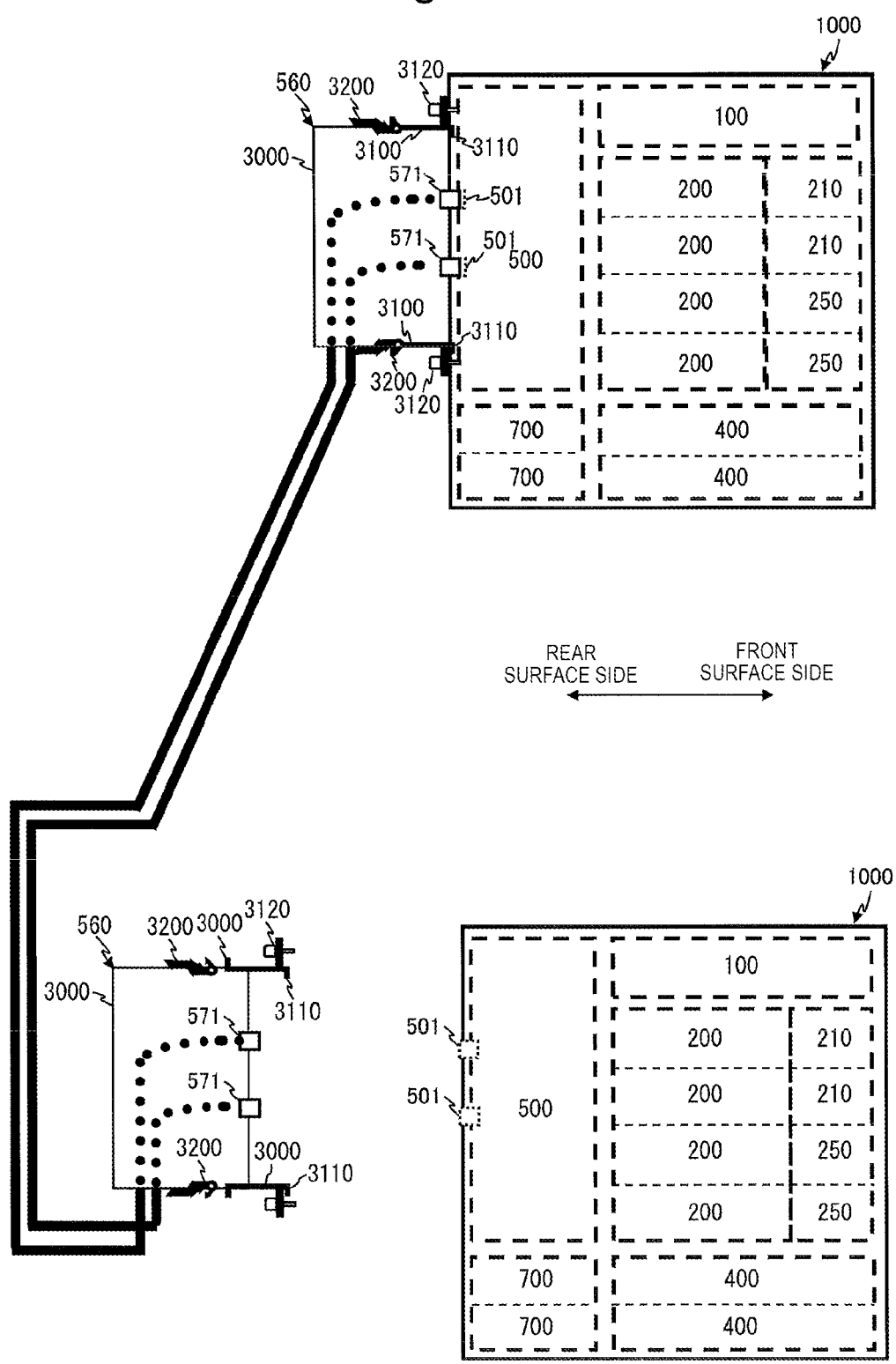

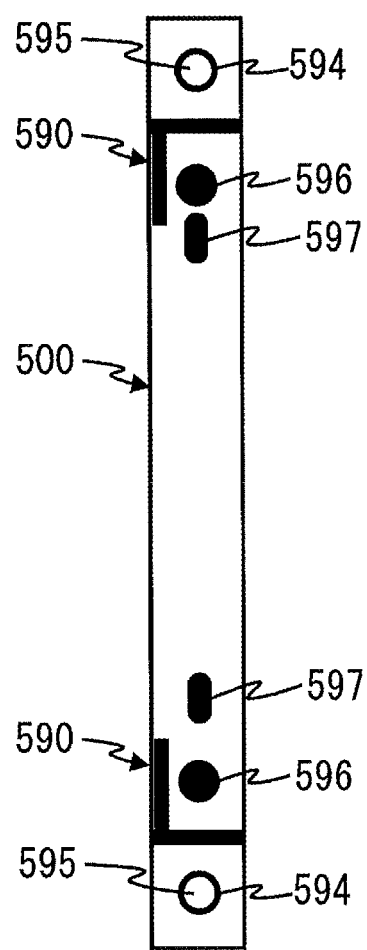

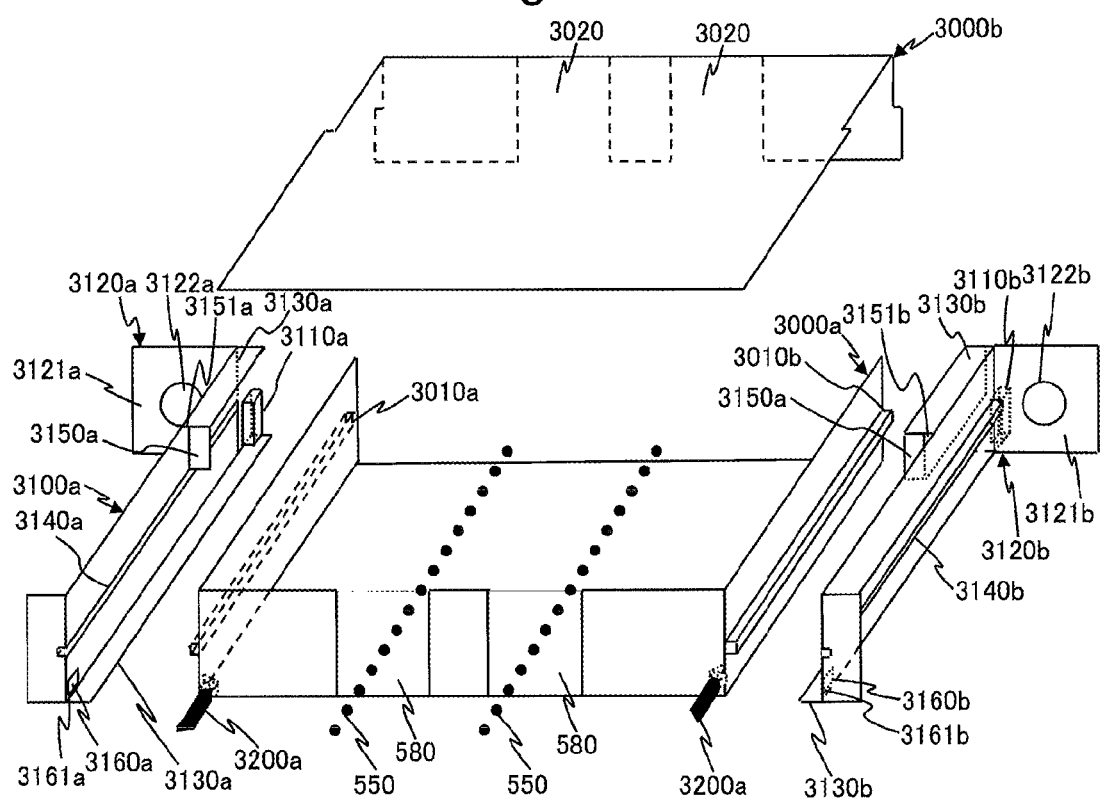

CONNECTOR HOUSING APPARATUS AND INTER-CONNECTOR CONNECTING SYSTEM

CLAIM OF PRIORITY

The present application claims priority from Japanese patent application JP 2015-035740 filed on Feb. 25, 2015, the content of which is hereby incorporated by reference into this application.

BACKGROUND OF THE INVENTION

Field of the Invention

The present invention relates to a connector housing apparatus that houses a connector which is fitted to an external connector of an external apparatus.

Background Art

Background art in the related field includes JP-A-2006-260541 and JP-A-4-113693.

The patent publication of JP-A-2006-260541 discloses as follows. "A slider is inserted into a slider guide frame, and thereby a guide groove moves along a boss from a flat section to an inclined section and another flat section. A boss is raised by the guide groove, a rail, in which the boss is formed, is lifted along a guide pin, and a printed circuit board held by the rail is lifted. After a positioning pin engages with a positioning hole in the printed circuit board and a socket connector is aligned with a cable connector, the socket connector is further lifted so as to be fitted to the cable connector" (refer to ABSTRACT).

JP-A-4-113693 discloses a structure holding a printed circuit board unit where a rod-shaped guide is mounted on a backboard in which a contact pin is implanted, the printed circuit board unit, on which a connector is mounted, slides on the rod-shaped guide, and the connector is fitted and connected to the contact pin.

There is a need to connect a plurality of RF connectors arranged outside two housings with a plurality of cables. However, a problem of an improper connection or the like arises when the plurality of cables are individually connected to the plurality of RF connectors. In addition, in order to prevent degradation in communication quality of the RF connectors, the respective cables and the respective RF connectors have to be accurately connected each other. Therefore, there is a demand that the plurality of cables and the plurality of RF connectors are collectively connected.

In JP-A-2006-260541, a structure of fitting the socket connector to the cable connector is mounted inside the housing. In addition, in JP-A-4-113693, the rod-shaped guide is attached by a screw from a surface of the backboard on the back side of the surface in which the contact pin is implanted.

Therefore, in both JP-A-2006-260541 and JP-A-4-113693, there is a need to perform operation from inside the housing. However, in the case where two housings in a completed state are connected to a plurality of cables, it is difficult to perform operation from inside the housings.

SUMMARY OF THE INVENTION

A purpose of the present invention is to provide a connector housing apparatus in which, to a plurality of external connectors provided in a housing, a plurality of connectors are collectively fitted from the outside of the hosing, and the fitting is performed with reliable accuracy.

According to a representative example of the present invention, there is provided a connector housing apparatus comprising: a main body section that has a plurality of connectors confronting a plurality of external connectors which an external housing has; and a moving guide section that guides movement of the main body section toward the external housing, wherein the moving guide section has a latching section that latches the moving guide section on the external housing, wherein the main body section is connected to the moving guide section so as to be movable in a fitting direction of the plurality of connectors in a state in which the moving guide section is latched on the external housing by the latching section, wherein the latching section latches the moving guide section on a position at which the plurality of connectors are fitted to the plurality of external connectors in a case where the main body section connected to the moving guide section moves along the moving guide section, and wherein the main body section moves along the moving guide section in the fitting direction of the plurality of connectors, and thereby the plurality of connectors are fitted to the plurality of external connectors.

Brief description of effects obtained by the representative inventions described in the present application is as follows. In other words, there is provided a connector housing apparatus in which, to a plurality of external connectors provided in a housing, a plurality of connectors are collectively fitted from the outside of the housing and the fitting is performed with accuracy.

Problems, configurations, and effects undescribed above are clearly described in the following description of embodiments.

BRIEF DESCRIPTION OF THE DRAWINGS

FIG. 3A is a rear view of a cartridge of Embodiment 1.

FIG. 4B is a diagram illustrating the switch fabric unit of Embodiment 1 viewed from the left side.

FIG. 6D is a diagram illustrating a state in which the connectors of Embodiment 1 are completely fitted to the another-communication-apparatus target connectors.

FIG. 9 is a rear view of a switch fabric unit of the first modification example of Embodiment 1.

FIG. 18 is an exploded perspective view of the cartridge of Embodiment 2.

DETAILED DESCRIPTION OF THE INVENTION

In the present embodiment describes an example in which a plurality of connectors 571 are connected to a plurality of another-communication-apparatus target connectors 501 that are included in a communication apparatus 1000, using a cartridge 560 (refer to FIG. 2), which is a connector housing apparatus that houses the plurality of connectors 571.

Figure 1A:
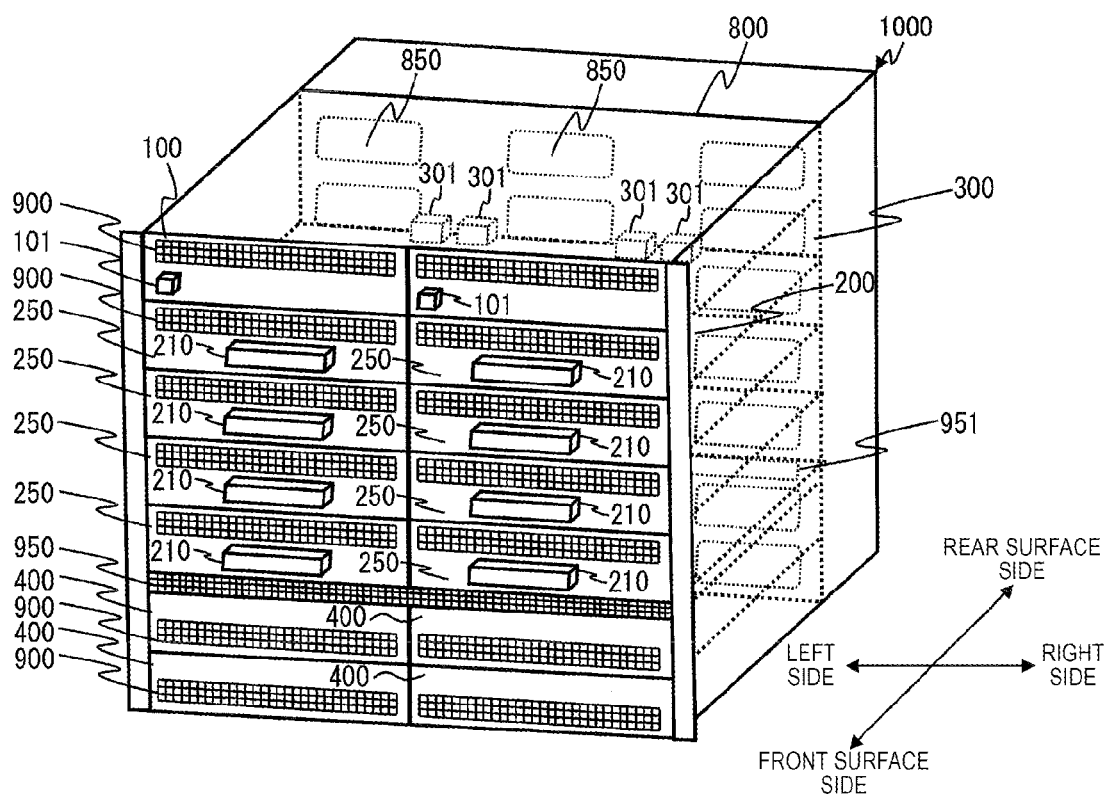
FIG. 1A is a perspective view on the front surface side of a communication apparatus of Embodiment 1.

FIG. 1A is a perspective view on the front surface side of the communication apparatus 1000 of Embodiment 1.

A basic control unit 100, a data transmission processing unit 250, and a front power unit 400 are arranged on the front surface side of the communication apparatus 1000. Hereinafter, a "unit" may be referred to as a "module" or a "card".

The basic control unit 100 controls the communication apparatus 1000. The basic control unit 100 has a connection section 101. The connection section 101 transmits a control signal controlling the communication apparatus 1000 to another communication apparatus and receives the control signal from another communication apparatus The data transmission processing unit 250 transmits a data signal to another communication apparatus and receives the data signal from another communication apparatus. The data transmission processing unit 250 determines a connection with an external communication apparatus and methods for processing received data and transmission target data. A network interface unit 200 is arranged on the front surface side of the data transmission processing unit 250, and a packet routing unit 300 is arranged on the rear surface side thereof. The network interface unit 200 transmits data to an external network and receives data from the external network. The network interface unit 200 has an external port 210 which connects the communication apparatus 1000 to the external network.

The packet routing unit 300 performs predetermined processing on a packet received from the external network by the external port 210 and identifies a destination. The packet routing unit 300 has a backplane connector 301 connected to a backplane 800. The backplane 800 connects the basic control unit 100 with another unit, and the basic control unit 100 outputs a signal to another unit through the backplane 800 and controls another unit.

Figure 1B:
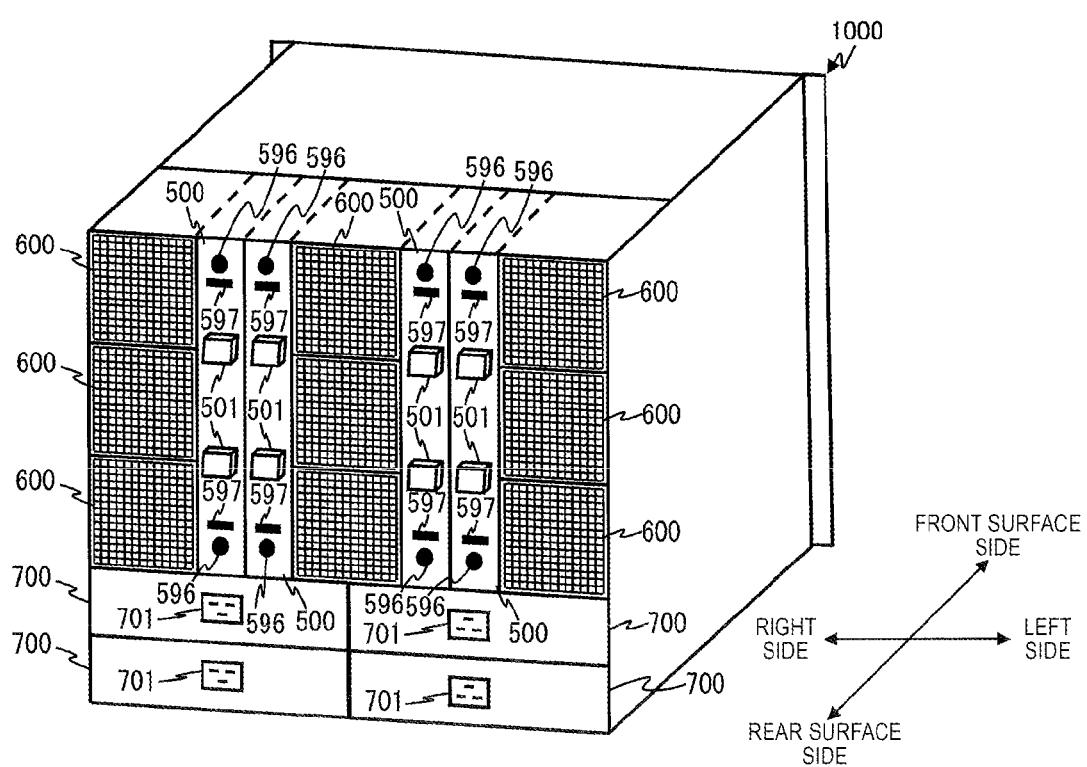
FIG. 1B is a perspective view on the rear surface side of the communication apparatus of Embodiment 1.

The front power unit 400 supplies power supplied to a power receiving unit 700 illustrated in FIG. 1B, to the basic control unit 100 and the data transmission processing unit 250.

Vents 900 may be arranged on the front surface of the basic control unit 100, on the front surface of the data transmission processing unit 250 (that is, the front surface of the network interface unit 200), and on the front surface of the front power unit 400. A FAN unit 600 illustrated in FIG. 1B inhales air through the vents 900 and components mounted on the respective units are cooled by the air inhaled through the vents 900. In addition, a vent 850 may also be arranged on the rear surface of the backplane 800. Further, a switch fabric unit 500 illustrated in FIG. 1B is cooled by a vent 950 and, the air inhaled through the vent 950 passes through a vent 951 on the backplane 800. Then, the air passes through the inside of the switch fabric unit 500, and thereby a component mounted on the switch fabric unit 500 is cooled.

FIG. 1B is a perspective view on the rear surface side of the communication apparatus 1000 of Embodiment 1.

The switch fabric unit 500, the FAN unit 600, and the power receiving unit 700 are arranged on the rear surface side of the communication apparatus 1000.

The switch fabric unit 500 transmits data between a plurality of packet routing units 300. In addition, the switch fabric unit 500 has a plurality of another-communication-apparatus target connectors 501 which are connected to another communication apparatus in a non-blocking connection manner. The non-blocking connection means that communication with another communication apparatus is performed through a connection at a bandwidth which is greater than or equals to the total bandwidth of the external port 210 without degrading (blocking) transmission performance of the external port 210. By the another-communication-apparatus target connectors 501 of the switch fabric unit 500 being connected to another communication apparatus, the communication apparatus 1000 is a redundant configuration for the other communication apparatus. In addition, the switch fabric unit 500 has a cartridge fixing screw hole 596 and a cartridge target opening 597.

The FAN unit 600 controls air flow inside the communication apparatus 1000. In addition, an exhaust port through which the air inhaled through the vents 900 is exhausted is arranged on the FAN unit 600. The air inhaled through the vent 900 passes through inside the communication apparatus 1000 and is exhausted through the exhaust port of the FAN unit 600. In this manner, a structure that air is inhaled through the front surface side of the communication apparatus 1000 and is exhausted from the rear surface side is referred to as a front inhale/rear exhaust structure.

The power receiving unit 700 has a connection section 701, which is connected to a power cable. Further, the communication apparatus 1000 is typically driven by power at 100 volts or 200 volts which is commercially available.

The basic control unit 100, the data transmission processing unit 250, and the front power unit 400 are connected to the front surface side of the backplane 800. In addition, the switch fabric unit 500, the FAN unit 600, and the power receiving unit 700 are connected to the rear surface side of the backplane 800. Further, a board surface, on which a circuit board of the data transmission processing unit 250, which is connected to the front surface side of the backplane 800, is mounted, a circuit board of the backplane 800, and a circuit board of the switch fabric unit 500 are orthogonal. The basic control unit 100, the data transmission processing unit 250, and the front power unit 400 are arranged on the front surface side of the communication apparatus 1000 so as to have their longitudinal directions in the right/left direction of the communication apparatus 1000. The switch fabric unit 500 is arranged on the rear surface side of the communication apparatus 1000 so as to have a longitudinal direction thereof in the vertical direction of the communication apparatus 1000.

Further, the circuit board of the switch fabric unit 500 and the backplane 800 are orthogonal. However, the circuit board of the switch fabric unit and the circuit board of the data transmission processing unit 250 do not need to be orthogonal, and the circuit board of the data transmission processing unit 250 may be parallel to the circuit board of the data transmission processing unit 250.

Figure 2:
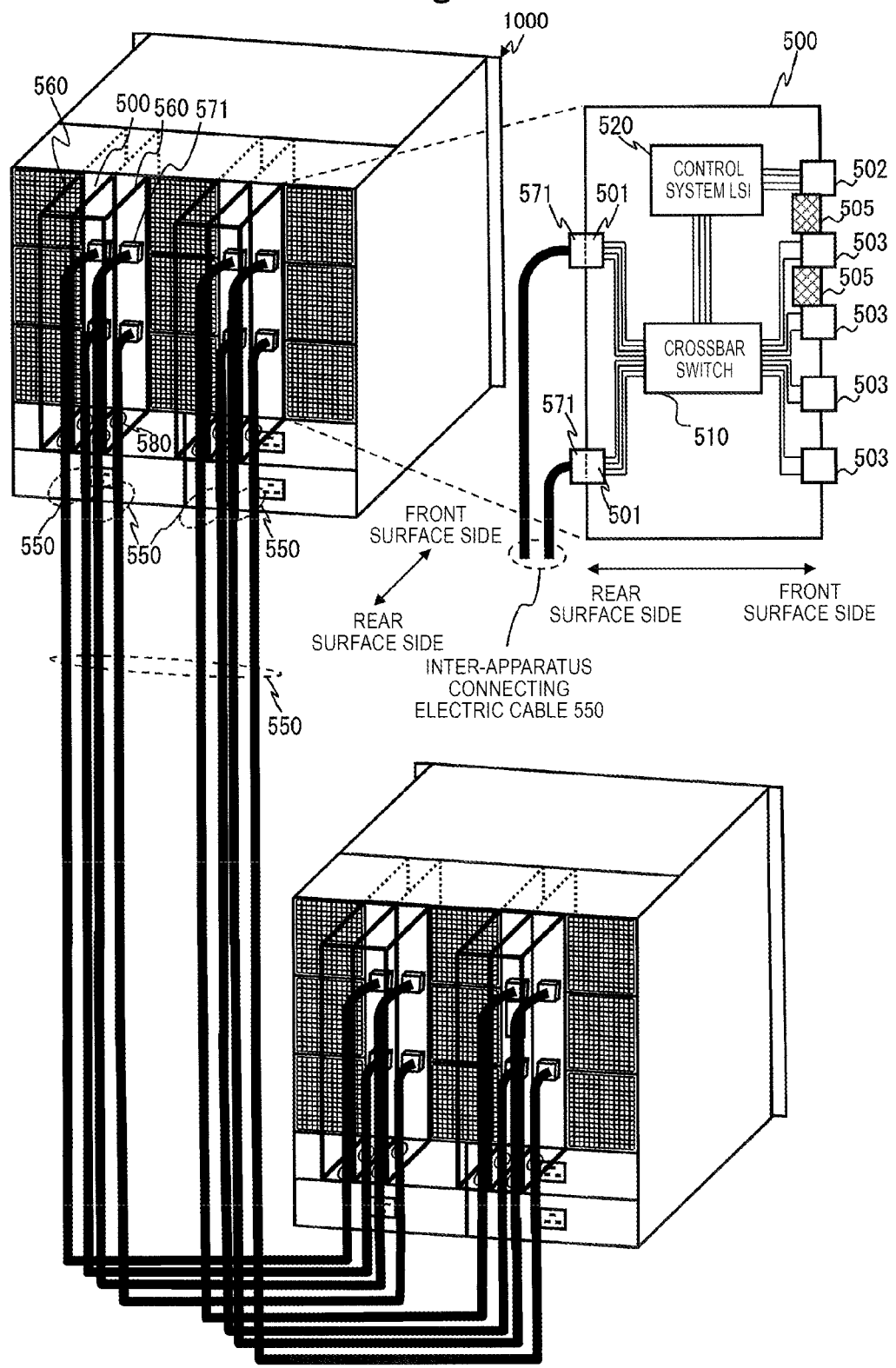
FIG. 2 is a diagram illustrating a connection between communication apparatuses of Embodiment 1.

FIG. 2 is a diagram illustrating a connection between communication apparatuses 1000 of Embodiment 1.

First, a configuration of the switch fabric unit 500 is described in FIG. 2.

The switch fabric unit 500 has the another-communication-apparatus target connector 501, a basic control unit target connector 502, a network line target connector 503, a crossbar switch 510, a control system large scale integration (LSI) 520, and a notch 505. The another-communication-apparatus target connector 501, the basic control unit target connector 502, the network line target connector 503, the crossbar switch 510, and the control system LSI 520 are connected through a signal line.

The basic control unit target connector 502 and the network line target connector 503 are arranged on the front surface side of the switch fabric unit 500 and the another-communication-apparatus target connector 501 is arranged on the rear surface side of the switch fabric unit 500.

The basic control unit target connector 502 and the network line target connector 503 are connected to the backplane 800. The basic control unit target connector 502 is connected to the basic control unit 100 through the backplane 800. The network line target connector 503 is connected to the data transmission processing unit 250 through the backplane 800. A signal of a control plane related to control of the communication apparatus 1000 is input from the basic control unit 100 through the basic control unit target connector 502 to the control system LSI 520. The signal of the control plane is output from the control system LSI 520 through the basic control unit target connector 502 to the basic control unit 100.

The another-communication-apparatus target connector 501 is connected to another communication apparatus 1000 through an inter-apparatus connecting electric cable 550. Input and output of a signal of a network line which is data actually transmitted are described below. In a case where the signal of the network line is input from the network line target connector 503, the crossbar switch 510 selects, from an another-communication-apparatus target connector 501 or a network line target connector 503, a connector which outputs destination of the input signal of the network line. The selected connector outputs the signal of the network line.

In a case where the signal of the network line is output to another data transmission processing unit 250 inside the communication apparatus 1000, the connector which outputs the signal is the network line target connector 503. In comparison, in a case where the signal of the network line is output to another communication apparatus 1000, the connector which outputs the signal is the another-communication-apparatus target connector 501.

In the present example, the communication apparatus 1000 and another communication apparatus 1000 are connected in the non-blocking connection manner. Therefore, all of the network lines are uniformly viewed from the control plane of a dedicated system, thus it is possible to eliminate exchanging a protocol between the control planes. Accordingly, it is possible to simplify the control and to prevent setting performance from being degraded.

The notch 505 inhales air which cools the crossbar switch 510 and the control system LSI 520.

Next, a connection between the communication apparatuses 1000 is described below.

A plurality of the communication apparatuses 1000 are connected through a plurality of the inter-apparatus connecting electric cable 550, and thereby the plurality of communication apparatuses 1000 are connected in the non-blocking connection manner, and some of the communication apparatus 1000 become redundant. The connectors 571, which are connected to the another-communication-apparatus target connectors 501, are arranged on both ends of the inter-apparatus connecting electric cable 550. The connectors 571 of the plurality of inter-apparatus connecting electric cables 550 are bundled and housed in the cartridge 560 (connector housing apparatus).

Inserting the cartridge 560 into the communication apparatus 1000 on the rear surface side by a user allows the plurality of connectors 571 housed in the cartridge 560 to collectively connect the plurality of confronting another-communication-apparatus target connectors 501. Therefore, it is possible to simplify an arrangement operation of the inter-apparatus connecting electric cables 550.

Here, the reasons that the connectors 571 and the plurality of another-communication-apparatus target connectors 501 are collectively connected using the cartridge 560 are described below.

Signals are transmitted at a high transmission rate between the communication apparatuses 1000, and the connectors 571 and the another-communication-apparatus target connectors 501 have pins arranged at high density. To achieve the high transmission rate, a metal portion of a fitting section between the connectors 571 and the anothercommunication-apparatus target connectors 501 needs to be reduced to the greatest extent possible. For example, a metal portion in a section other than a section with which the fitting section actually comes into contact is reduced to the greatest extent possible. This is because the metal portion causes an adverse effect on signal quality. If objects are fitted, the objects have fitting shape and are fitted.

In addition, since the pins are arranged at high density, the pins are small. Therefore, an allowable limit of error of a fitting degree between the connectors 571 and the another-communication-apparatus target connectors 501 also small.

In addition, in a case where the connectors 571 and the another-communication-apparatus target connectors 501 are fitted one by one, there is a possibility that the connectors 571 is fitted to a wrong another-communication-apparatus target connector 501, thus the operation can be complicated.

Accordingly, the plurality of connectors 571 and the plurality of another-communication-apparatus target connectors 501 need to be collectively fitted and connected using the cartridge 560.

The cartridge 560 has a guide section 580 through which the plurality of inter-apparatus connecting electric cables 550 housed inside the cartridge are guided to the outside. The cartridge 560 has a substantially cuboid shape. A surface below the connectors 571 (undersurface) of the cartridge 560 has a hole which becomes the guide section 580 (undersurface), in a case where the cartridge 560 is attached to the communication apparatus 1000. The hole is formed to have a diameter greater than that of one inter-apparatus connecting electric cable 550 and the inter-apparatus connecting electric cable 550 is guided to the outside of the cartridge 560 through the hole. In the example illustrated in FIG. 2, the hole has an enough diameter to enable only one inter-apparatus connecting electric cable 550 to pass through. Therefore, two holes are formed in the cartridge 560 because only one inter-apparatus connecting electric cable 550 can pass through one hole, and one cartridge 560 houses two inter-apparatus connecting electric cables 550.

Further, one hole may be formed to have an enough diameter to enable the plurality of inter-apparatus connecting electric cables 550 to pass through.

Figure 3B:
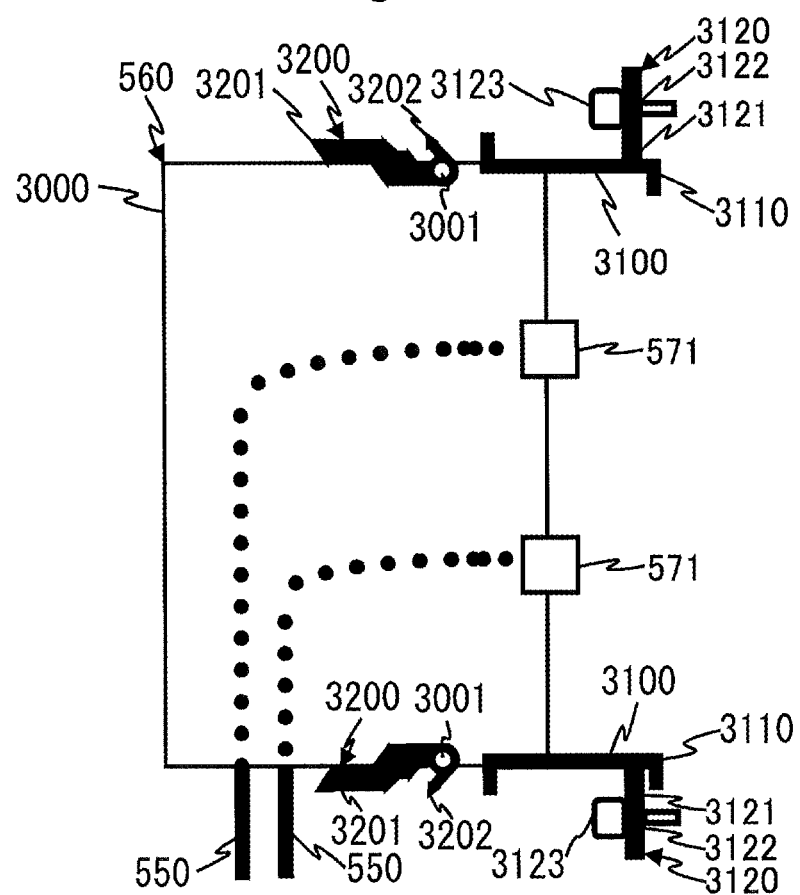
FIG. 3B is a diagram illustrating the cartridge of Embodiment 1 viewed from the left side.
Figure 3C:
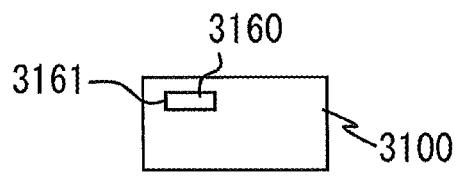
FIG. 3C is a diagram illustrating a guide rail attached to an undersurface side of the cartridge of Embodiment 1 viewed from a main body section side.

FIGS. 3A to 3C are views illustrating the cartridge 560. A surface on which the connectors 571 are arranged is referred to as a front surface of the cartridge 560. A surface opposite to the front surface of the cartridge 560 is referred to as a rear surface thereof. In a case where the cartridge 560 is attached to the communication apparatus 1000, a surface above the connectors 571 and a surface below the connectors 571 are referred to as the top surface of the cartridge 560 and the undersurface of the cartridge 560, respectively. In addition, in a case where the cartridge 560 is attached to the communication apparatus 1000, a surface on the left side from the connectors 571 viewed from the front surface side of the communication apparatus 1000, is referred to as the left surface of the cartridge 560. A surface on the right side from the connectors 571 viewed from the front surface side of the communication apparatus 1000 is referred to as the right surface of the cartridge 560.

FIG. 3A is a rear view of the cartridge 560 of Embodiment 1. FIG. 3B is a diagram illustrating the cartridge 560 of Embodiment 1 viewed from the left side. FIG. 3C is a diagram illustrating a guide rail 3100 attached to an undersurface side of the cartridge 560 of Embodiment 1 viewed from a main body section 3000 side. Further, in FIG. 3B, a part of a cartridge inserting-removing lever 3200 inside the main body section 3000 is not actually viewed on the left surface of the cartridge 560, but the part is illustrated in the drawing for description. In addition, in FIG. 3A, a part of the cartridge inserting-removing lever 3200 outside the main body section 3000 is actually viewed on the rear surface of the cartridge 560, but the part is omitted in the drawing for description.

As illustrated in FIG. 3B, the cartridge 560 has the main body section 3000, the guide rail (moving guide section) 3100, and the cartridge inserting-removing lever 3200.

The main body section 3000 houses connectors 571 on one-side ends of the plurality of inter-apparatus connecting electric cables 550. The plurality of connectors 571 are arranged on the front surface of the main body section 3000, and the plurality of connectors 571 are connected to the plurality of another-communication-apparatus target connectors 501 of the communication apparatus 1000. Further, the front surface of the cartridge 560 on which the connectors 571 are arranged is also referred to as a fitting surface.

The guide rail 3100 is attached on the front surface side and the undersurface side of the main body section 3000. In the following description, the guide rail 3100 on the top surface side of the main body section 3000 and the guide rail 3100 on the undersurface side of the main body section 3000 may be referred to as an upper side guide rail 3100 and a lower-side guide rail 3100, respectively. The same is true of other components. The guide rail 3100 has plate shape and the guide rail 3100 is connected to the main body section 3000 so that the longitudinal direction thereof extends toward the communication apparatus 1000 side from the main body section 3000. The main body section 3000 is connected to the guide rail 3100 so as to be movable on the guide rail 3100. The guide rail 3100 guides movement of the main body section 3000 toward the communication apparatus 1000 side. The main body section 3000 moves on the guide rail 3100 in a fitting direction of a connector 571. The fitting direction of the connector 571 means a direction in which the connector 571 is fitted to the another-communication-apparatus target connector 501. A surface (a top surface or a undersurface of the main body section 3000) which moves on the guide rail 3100 of the main body section 3000 is referred to as a main-body-section movement surface, and a surface (an undersurface of the upper side guide rail 3100 and the top surface of the lower-side guide rail 3100) of the guide rail 3100 on which the main body section 3000 moves is referred to as a guide-rail movement surface.

The guide rail 3100 has a latching section 3110 and a guide rail fixing portion 3120. The latching section 3110 performs locking of the main body section 3000 and the guide rail 3100 to the communication apparatus 1000. The latching section 3110 is formed at an end part of the guide-rail movement surface on the communication apparatus 1000 side and is perpendicular to the guide-rail movement surface. As illustrated in FIG. 3B, the guide-rail movement surface and the cross sectional plane of the latching section 3110 form an L shape. Specifically, the latching section 3110 of the guide rail 3100 which is attached to the top surface side and the undersurface side of the main body section 3000 is formed to be perpendicular to the respective guide-rail movement surfaces and to be placed below the respective guide-rail movement surface.

The latching section 3110 is inserted into a cartridge target opening 597 of the switch fabric unit 500 illustrated in FIG. 4B, and thereby the latching section 3110 comes into contact with a wall surface which forms the cartridge target opening 597. Further, "come into contact with" means to reach and contact occurs. Accordingly, the latching section 3110 can latch the guide rail 3100 on the switch fabric unit 500 and can latch the main body section 3000, which is connected to the guide rail 3100, on the switch fabric unit 500. Further, in a case where the main body section 3000 connected to guide rail 3100 moves along the guide rail 3100, the latching section 3110 latches the guide rail 3100 on a position at which the connectors 571 are fitted to the another-communication-apparatus target connectors 501.

A guide rail fixing section 3120 fixes the guide rail 3100 to the communication apparatus 1000. The latching section 3110 is closer to the communication apparatus 1000 than the guide rail fixing section 3120. Therefore, after the guide rail 3100 is latched on the communication apparatus 1000 by the latching section 3110, and then the guide rail 3100 is fixed to the communication apparatus 1000 by the guide rail fixing section 3120.

The guide rail fixing section 3120 has a guide rail fixing surface 3121, a hole 3122, and a guide rail fixing screw 3123. The guide rail fixing surface 3121 is parallel to the front surface (fitting surface) of the main body section 3000, and the hole 3122 is formed thereon. The guide rail fixing surface 3121 is formed at the guide-rail movement surface on a side which is opposite to the communication apparatus 1000 from the latching section 3110 and is perpendicular to the guide-rail movement surface. Specifically, the guide rail fixing surface 3121 of the guide rail 3100 which is connected to the top surface side of the main body section 3000 is formed to be perpendicular to the guide-rail movement surface and to be placed above the guide-rail movement surface. The guide rail fixing surface 3121 of the guide rail 3100 which is connected to the undersurface side of the main body section 3000 is formed to be perpendicular to the guide-rail movement surface and to be placed below the guide-rail movement surface.

The guide rail fixing screw 3123 is fastened to the cartridge fixing screw hole 596 of the switch fabric unit 500 illustrated in FIG. 4B through the hole 3122, and then the guide rail 3100 is fixed to the communication apparatus 1000. Further, in a case where the guide rail fixing surface 3121 is parallel to the rear surface of the communication apparatus 1000 by the latching section 3110 latching the guide rail 3100 on the communication apparatus 1000, the hole 3122 and the cartridge fixing screw hole 596 are formed at a position at which the hole 3122 communicates with the cartridge fixing screw hole 596. Here, "communicate with" means to continuously penetrate through.

The guide rail fixing screw 3123 is fastened using a driver or the like, but a user may fasten the guide rail fixing screw by hand. The hole 3122 may be a through hole or may be a screw hole.

The cartridge inserting-removing lever 3200 is operated in a case where the connectors 571 are completely fitted to the another-communication-apparatus target connectors 501 and in a case where the connectors 571 completely fitted to the another-communication-apparatus target connectors are removed from the another-communication-apparatus target connectors 501. The cartridge inserting-removing lever 3200 is turnably attached to the turning shaft 3001 arranged on the main body section 3000.

The cartridge inserting-removing lever 3200 has an operation lever portion 3201 and a claw portion 3202. One end side of the cartridge inserting-removing lever through the turning shaft 3001 is the operation lever portion 3201, and the other end side is the claw portion 3202. The operation lever portion 3201 is a portion which is operated by a user. The claw portion 3202 engages with a notch 3160 provided in the guide rail 3100 illustrated in FIG. 3C. The operation lever portion 3201 protrudes to the outside from the main body section 3000, and the claw portion 3202 is positioned inside the main body section 3000. The main body section 3000 has a hole (not illustrated) through which the claw portion 3202 protrudes. By the operation lever portion 3201 turning to a predetermined position, the claw portion 3202 can protrude from the main-body-section movement surface through the hole of the main body section 3000 and engage with a terminal end 3161 of the notch 3160 on the rear surface side of the main body section 3000.

The notch 3160 is arranged on a position at which the main body section 3000 reaches a predetermined position of the guide rail 3100 and at which the claw portion 3202 can engage with the guide rail in a case where the operation lever portion 3201 turns by a predetermined angel. The predetermined position is, for example, a position at which the connectors 571 are fitted but not completely fitted to the another-communication-apparatus target connectors 50.

Figure 4A:
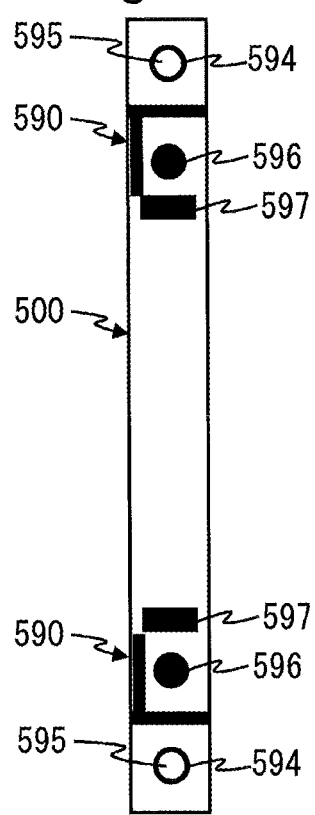
FIG. 4A is a rear view of a switch fabric unit of Embodiment 1.

Next, the switch fabric unit 500 is described below with FIGS. 4A and 4B. FIG. 4A is a rear view of the switch fabric unit 500 of Embodiment 1. FIG. 4B is a diagram illustrating the switch fabric unit 500 of Embodiment 1 viewed from the left side. In FIG. 4B, a part of a switch fabric unit inserting-removing lever 590 inside the switch fabric unit 500 is not actually viewed on the left surface of the switch fabric unit 500, but the part is illustrated in the drawing for description. The switch fabric unit inserting-removing lever 590 is attached to the switch fabric unit 500 at a turning shaft 504 and can turn around the turning shaft 504. In a case where the switch fabric unit 500 is inserted, a switch fabric unit inserting-removing lever handles 591 are pushed into the communication apparatus 1000 from the vertical direction. At this time, the insertion is operated with the principle of leverage by a switch fabric unit inserting-removing lever claw 592 being latched to the housing. In a case where the switch fabric unit 500 is removed, the switch fabric unit inserting-removing lever handles 591 are opened in the vertical direction of the communication apparatus 1000. At this time, the removal is operated by the switch fabric unit inserting-removing lever 590 having an angle so as to reach the housing.

A switch fabric unit fixing hole 594, the cartridge fixing screw hole 596, and the cartridge target opening 597 are formed on the rear surface of the housing of the switch fabric unit 500,. In addition, the turning shaft 504 is arranged on the rear surface side of the housing of the switch fabric unit 500, and the switch fabric unit inserting-removing lever 590 is turnably attached to the turning shaft 504.

Two switch fabric unit fixing holes 594 are formed on the upper end and the lower end of the rear surface of the switch fabric unit 500. The switch fabric unit fixing screw 595 is fixed to a screw hole (not illustrated) formed in the housing of the communication apparatus 1000 through the switch fabric unit fixing hole 594. Accordingly, the switch fabric unit 500 is fixed to the communication apparatus 1000. The switch fabric unit fixing hole 594 may be a screw hole or a through hole.

The cartridge fixing screw hole 596 is a screw hole formed in the rear surface of the switch fabric unit 500. The guide rail fixing screw 3123 is inserted into the cartridge fixing screw hole 596, and thereby the guide rail 3100 is fixed to the switch fabric unit 500.

The cartridge target opening 597 is formed on the rear surface of the switch fabric unit 500 have an enough size to insert the latching section 3110 which has an L shape. Specifically, the cartridge target opening 597 has a rectangular shape whose longitudinal direction is the short direction of the switch fabric unit 500. When the latching section 3110 is inserted into the cartridge target opening 597, the end portion of the guide-rail movement surface which forms an L shape with the latching section 3110 comes into contact with the undersurface which forms the cartridge target opening 597. In this state, the guide rail fixing screw 3123 is inserted into the cartridge fixing screw hole 596, and the guide rail 3100 is fixed to the switch fabric unit 500. The undersurface which forms the cartridge target opening 597 is on a position which enables, when the main body section 3000 connected to the guide rail 3100 moves to the fitting direction of the guide rail 3100 to the connector 571, the connectors 571 and the another-communication-apparatus target connectors 501 to move to a fitting position.

Therefore, the cartridge fixing screw hole 596 is on a position at which the hole 3122 communicates with the cartridge fixing screw hole 596 in a state in which the guide rail 3100 comes into contact with the cartridge target opening 597. In other words, a position of the upper side cartridge fixing screw hole 596 is so determined that a distance between the undersurface of the upper side cartridge target opening 597 and the center of the upper side cartridge fixing screw hole 596 can equal to a distance between the center of the hole 3122 and the guide-rail movement surface of the upper side guide rail 3100 illustrated in FIG. 3B. In addition, a position of the lower side cartridge fixing screw hole 596 is so determined that a distance between the undersurface of the lower side cartridge target opening 597 and the center of the lower side cartridge fixing screw hole 596 can equal to a distance between the center of the lower side hole 3122 and a surface (undersurface of the lower side guide rail 3100) of the lower side guide rail 3100 on which the guide rail fixing section 3120 of the lower side guide rail 3100 is formed illustrated in FIG. 3B.

When, in a state that a gap is formed between the guide rail fixing surface 3121 and the rear surface of the switch fabric unit 500, the guide rail fixing screw 3123 is fastened to the cartridge fixing screw hole 596 and the guide rail 3100 is fixed to the switch fabric unit 500, there is a possibility that the guide rail fixing surface 3121 is to be distorted. Therefore, a length between the guide rail fixing surface 3121 of the guide rail 3100 and the surface of the latching section 3110 on the guide rail fixing surface 3121 side is formed to be equal to a thickness of the plate of the rear surface of the switch fabric unit 500. Accordingly, the guide rail fixing surface 3121 and the rear surface of the switch fabric unit 500 come into close contact with each other without a gap therebetween. Therefore, during the fixing of the guide rail 3100 to the switch fabric unit 500, it is possible to prevent the guide rail fixing surface 3121 from being distorted.

Figure 5:
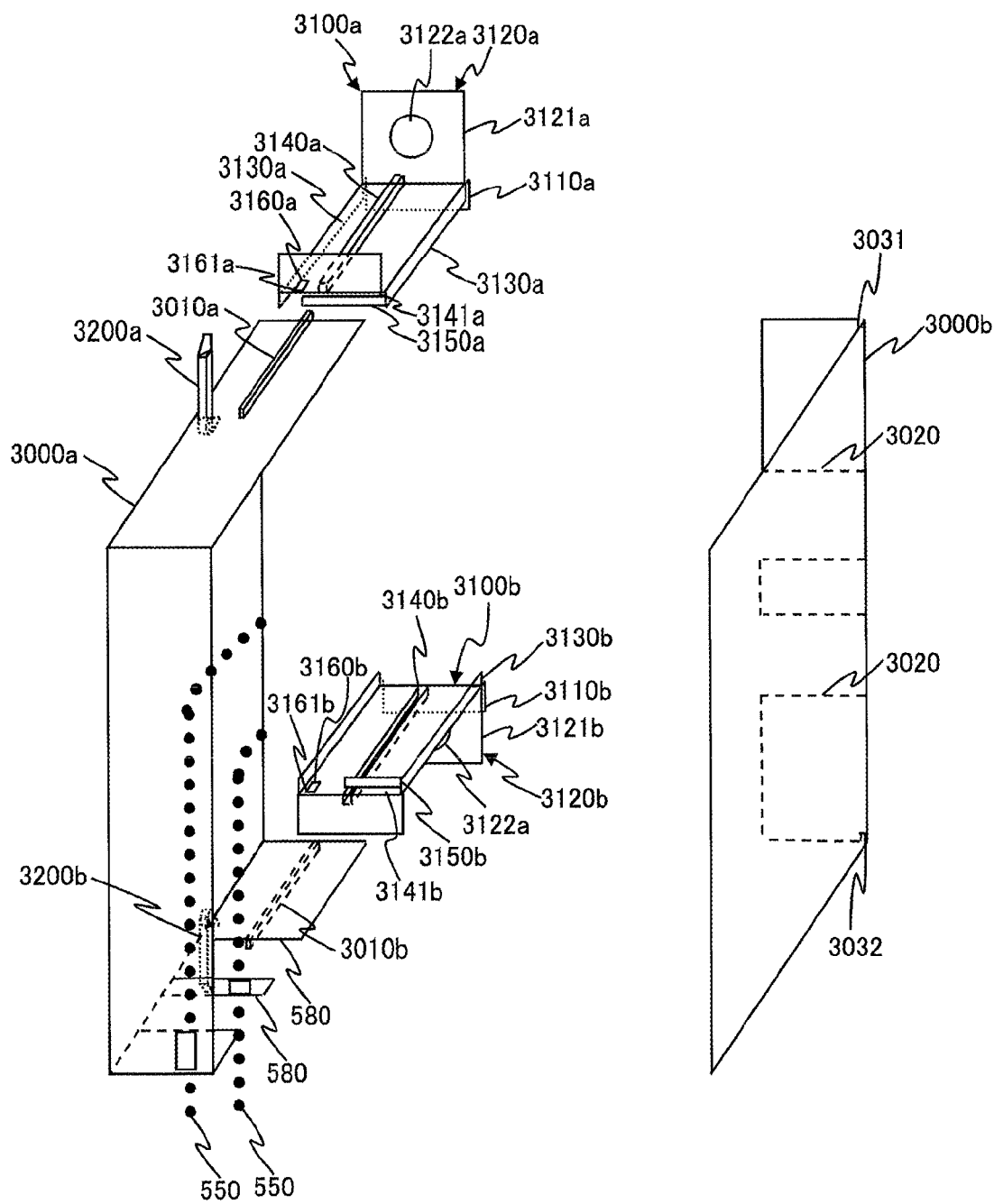
FIG. 5 is an exploded perspective view of the cartridge of Embodiment 1.

FIG. 5 is an exploded perspective view of the cartridge 560 of Embodiment 1.

The cartridge 560 of this embodiment is an integral type of cartridge, in which the main body section 3000 and the guide rail 3100, when a user attaches the cartridge to the communication apparatus 1000, are integrally formed and the guide rail 3100 is not removed from the main body section 3000. Specifically, a part of the guide rail 3100 is incorporated into the inside of the main body section 3000 when the cartridge 560 is assembled.

The main body section 3000 has two main body section metal plates 3000a and 3000b. The main body section metal plate 3000a has surfaces which become the top surface, the undersurface, the right surface, and the rear surface of the main body section 3000 and the main body section metal plate 3000b has surfaces which become the left surface and the front surface of the main body section 3000. In the case where the cartridge 560 is attached to the switch fabric unit 500, the top surface of the main body section 3000 is a surface positioned above the connectors 571, the undersurface of the main body section 3000 is a surface positioned below the connectors 571, the left surface of the main body section 3000 is a surface positioned on the left side from the connectors 571 viewed from the front side of the communication apparatus 1000, and the right surface of the main body section 3000 is a surface positioned on the right side from the connectors 571 viewed from the front side of the communication apparatus 1000. In addition, the front surface of the main body section 3000 is a surface of the main body section 3000 on which the connectors 571 are attached The rear surface of the main body section 3000 is a surface on the side opposite to the front surface of the main body section 3000. Further, the main body section 3000 may be formed of a material other than the metallic material.

The guide section 580, which guides the inter-apparatus connecting electric cable 550 housed in the main body section 3000 to the outside of the main body section 3000, is formed on the undersurface of the main body section metal plate 3000a. In addition, a notch 3020, which causes the connectors 571 to protrude from the main body section 3000, is provided on the front surface of the main body section metal plate 3000b.

The main body section metal plates 3000a and 3000b are assembled so that the main body section metal plate 3000b can cover the main body section metal plate 3000a to which the inter-apparatus connecting electric cable 550 is fixed. Before the main body section metal plates 3000a and 3000b are assembled, a guide rail 3100a, which is the upper side guide rail 3100, is attached to the top surface of the main body section metal plate 3000a, and a guide rail 3100b, which is the lower side guide rail 3100, is attached to the undersurface of the main body section metal plate 3000b.

The guide rail 3100a has a latching section 3110a, a guide rail fixing section 3120a, a guide rail fixing surface 3121a, a hole 3122a, a guide rail assistant portion 3130a, a rail 3140a, a fall preventing claw portion 3150a, and a notch 3160a. Similarly, the guide rail 3100b has a latching section 3110b, a guide rail fixing section 3120b, a guide rail fixing surface 3121b, a hole 3122b, a guide rail assistant portion 3130b, a rail 3140b, a fall preventing claw portion 3150b, and a notch 3160b.

Since the latching sections 3110a and 3110b, the guide rail fixing sections 3120a and 3120b, the guide rail fixing surfaces 3121a and 3121b, and the holes 3122a and 3122b are described above with FIGS. 3A and 3B, description thereof is omitted.

The rail 3140a is a recessed section arranged on the guide-rail movement surface of the guide rail 3100a and is fitted to a rail 3010a, which is a protruding section arranged on the main-body-section movement surface of the main body section metal plate 3000a. The rail 3140a, which has a straight shape toward the communication apparatus 1000 side or the latching section 3110a side, is formed.

The rail 3010a, which is the protruding section of the main body section 3000, is fitted to the rail 3140a, which is the recessed section, and thereby the main body section 3000 is connected to the guide rail 3100. Since the main body section 3000 moves on the guide rail 3100 in a state in which the rail 3140a and the rail 3010a are fitted, it is possible to regulate movement of the main body section 3000 in directions other than a direction in which the rail 3140a and the rail 3010a extend, thus the main body section 3000 moves on the straight line of the guide rail 3100 in the fitting direction of the connector 571. Accordingly, it is possible to prevent the main body section 3000 from being moving after being shifted in the right-left direction of the communication apparatus 1000, to prevent the connectors 571 and the another-communication-apparatus target connectors 501 from not fitting, and to improve fitting accuracy. Further, since the rail 3140*b* is the same as the rail 3140*a*, the description thereof is omitted. Here, the extending means to provide in an elongated manner.

The rail 3140*a* and the rail 3140*b* are fitted each other and regulate the movement of the main body section 3000 in directions other than a direction of the communication apparatus 1000. The same is true of the rails 3010*a* and 3010*b*. For example, rail 3140*a* and the rail 3140*b* may be protruding sections, and the rails 3010*a* and 3010*b* may be recessed sections.

The guide rail assistant portions 3130*a* and 3130*b* are arranged to be upright, to be perpendicular to a direction in which the main body section 3000 is positioned on the guide-rail movement surface, from both long sides of the guide-rail movement surface of the guide rails 3100*a* and 3100*b*. The longitudinal direction of the guide-rail movement surface is the movement direction of the main body section 3000, and the short direction of the guide-rail movement surface and the movement direction of the main body section 3000 are orthogonal. The guide rail assistant portions 3130*a* and 3130*b* can regulate the movement of the main body section 3000 in the right-left direction of the communication apparatus 1000 and play a role of assisting to the rail 3010*a*.

The fall preventing claw portion 3150*a* is formed at the end part on the side of the guide rail assistant portion 3130*a* opposite to the communication apparatus 1000 side. A notch 3141*a* is formed between the fall preventing claw portion 3150*a* and the guide-rail movement surface. Similarly, the fall preventing claw portion 3150*b* and a notch 3141*b* are also formed in the guide rail 3100*b*.

The top surface of the main body section metal plate 3000*a* passes through the notch 3141*a*, the rail 3010*a* of the main body section metal plate 3000*a* is fitted to the rail 3140*a* of the guide rail 3100*a*, and the guide rail 3100*a* is connected to the main body section metal plate 3000*a*. The undersurface of the main body section metal plate 3000*a* passes through the notch 3141*b*, the rail 3010*b* of the main body section metal plate 3000*a* is fitted to the rail 3140*b* of the guide rail 3100*b*, and the guide rail 3100*b* is connected to the main body section metal plate 3000*a*. The main body section metal plate 3000*b* is assembled to the main body section metal plate 3000*a* connected to the guide rails 3100*a* and 3100*b*.

In a state in which the main body section metal plate 3000*a* and the main body section metal plate 3000*b* are assembled, the guide rail assistant portions 3130*a* and 3130*b* and the fall preventing claw portions 3150*a* and 3150*b* are positioned inside the main body section 3000. Notches 3031 and 3032 are formed on the upper end and the lower end of the front surface of the main body section metal plate 3000*b* so that the guide rail assistant portions 3130*a* and 3130*b* positioned inside the main body section 3000 cannot come into contact with the front surface of the main body section metal plate 3000*b*. Even when the main body section 3000 moves on the guide rail 3100, the guide rail assistant portions 3130*a* and 3130*b* passes through the notches 3031 and 3032. Therefore, it is possible to prevent the guide rail assistant portions 3130*a* and 3130*b* from coming into contact with the front surface of the main body section metal plate 3000*b* and to prevent from the main body section 3000 from not moving.

The fall preventing claw portions 3150*a* and 3150*b* positioned inside the main body section 3000 come into contact with the front surface of the main body section metal plate 3000*b*, and thereby it is possible to prevent the guide rails 3100*a* and 3100*b* from falling from the main body section 3000.

Next, cartridge inserting-removing levers 3200*a* and 3200*b* and the notches 3160*a* and 3160*b* are described below.

The cartridge inserting-removing levers 3200*a* and 3200*b* are turnably attached to the main body section metal plate 3000*a*. The cartridge inserting-removing levers 3200*a* and 3200*b* turn between an angle (angle of the operation lever portion 3201 illustrated in FIG. 5, FIG. 6B, and FIG. 6C) at which the operation lever portion 3201 illustrated in FIG. 3B is perpendicular to the main-body-section movement surface and an angle (angle of the operation lever portion 3201 illustrated in FIG. 3B and FIG. 6D) at which the operation lever portion 3201 is parallel to the main-body-section movement surface.

The claw portion 3202 protrudes from the main-body-section movement surface at an angle at which the operation lever portion 3201 is perpendicular to the main-body-section movement surface so as to engage with the notch 3160*a*. In a case where the main body section 3000 moves to a predetermined position of the guide rail 3100 and the operation lever portion 3201 is operated to the angle at which the operation lever portion is perpendicular to the main-body-section movement surface, the claw portion 3202 engages with the notches 3160*a* and 3160*b*. Specifically, in the case where the operation lever portion 3201 is operated to the angle at which the operation lever portion is perpendicular to the main-body-section movement surface, the claw portion 3202 comes into contact with end portions 3161*a* and 3161*b* of the notches 3160*a* and 3160*b* on a side of the main body section 3000 in a rear surface direction, and the claw portion 3202 engages with the notches 3160*a* and 3160*b*. When, in a state in which the claw portion 3202 engages with the notches 3160*a* and 3160*b*, the operation lever portion 3201 is turned to the side of the main body section 3000 in the rear surface direction and the operation lever portion 3201 turns to the angle at which the operation lever portion is parallel to the main-body-section movement surface, the claw portion 3202 pulls the guide rails 3100*a* and 3100*b* through the notches 3160*a* and 3160*b* to the rear surface direction of the main body section 3000. In other words, a force moving the guide rails 3100*a* and 3100*b* to the rear surface direction of the main body section 3000 acts on the guide-rail movement surface. However, since the guide rails 3100*a* and 3100*b* are fixed to the switch fabric unit 500, the main body section 3000 moves to the fitting direction of the connector 501. Accordingly, the connectors 571 of the main body section 3000 are completely fitted to the another-communication-apparatus target connectors 501 of the switch fabric unit 500.

Further, a distance between the latching section 3110 and the guide-rail movement surface is less than a distance between the guide-rail movement surface and a position at which the guide rail fixing section 3120 fixes the guide rail 3100. In this embodiment, since the latching section 3110 is arranged to be perpendicularly upright from the guide-rail movement surface, the distance between the latching section 3110 and the guide-rail movement surface is zero. In addition, the position at which the guide rail fixing section 3120 fixes the guide rail 3100 is the center of the hole 3122 of the guide rail fixing surface 3121. Hence, in this embodiment, the distance between the latching section 3110 and the guide-rail movement surface is less than the distance between the guide-rail movement surface and the position at which the guide rail fixing section 3120 fixes the guide rail 3100.

The force moving the guide rails 3100a and 3100b to the rear surface direction acts on the guide-rail movement surface in which the notch 3160, which engages with the claw portion 3202 of the cartridge inserting-removing lever 3200, is formed. There is a possibility that the force deforms the guide rails 3100a and 3100b (particularly, guide rail fixing surface 3121) because the guide-rail movement surface and the position at which the guide rail fixing section 3120 fixes the guide rails 3100a and 3100b are apart.

The distance between the latching section 3110 and the guide-rail movement surface is less than the distance between the guide-rail movement surface and the position at which the guide rail fixing section 3120 fixes the guide rail 3100. This enables the latching section 3110 to absorb the force moving the guide rails 3100a and 3100b to the rear surface direction, enables reducing the force acting on the guide rail fixing surface 3121, and prevents the guide rails 3100a and 3100b from being deformed.

Further, in this embodiment, since the distance between the latching section 3110 and the guide-rail movement surface is zero, it is possible to absorb, in a straight line, the force moving the guide rails 3100a and 3100b to the rear surface direction. Therefore, the force moving the guide rails 3100a and 3100b to in the rear surface direction does not act on the guide rail fixing surface 3121, thus it is possible to prevent the guide rails 3100a and 3100b from being deformed.

Next, attaching the cartridge 560 to the communication apparatus 1000 is described below with FIGS. 6A to 6D.

Figure 6A:
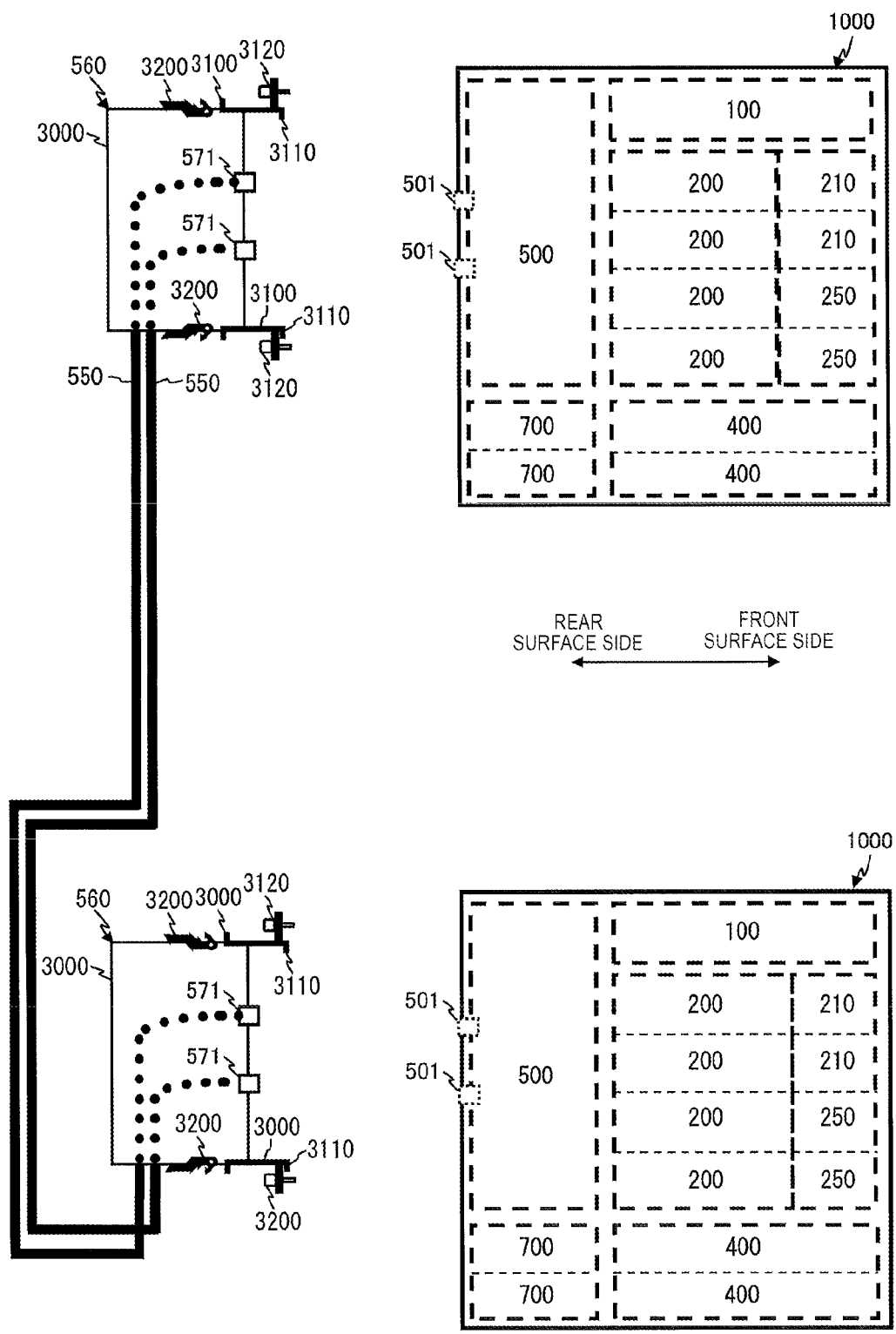
FIG. 6A is a diagram illustrating a state before attaching the cartridge to the communication apparatus of Embodiment 1.

FIG. 6A is a diagram illustrating a state before attaching the cartridge 560 of Embodiment 1 to the communication apparatus 1000. In FIG. 6A, the connectors 571, which are at both ends of the plurality of inter-apparatus connecting electric cables 550, are housed in two cartridges 560.

Figure 6B:
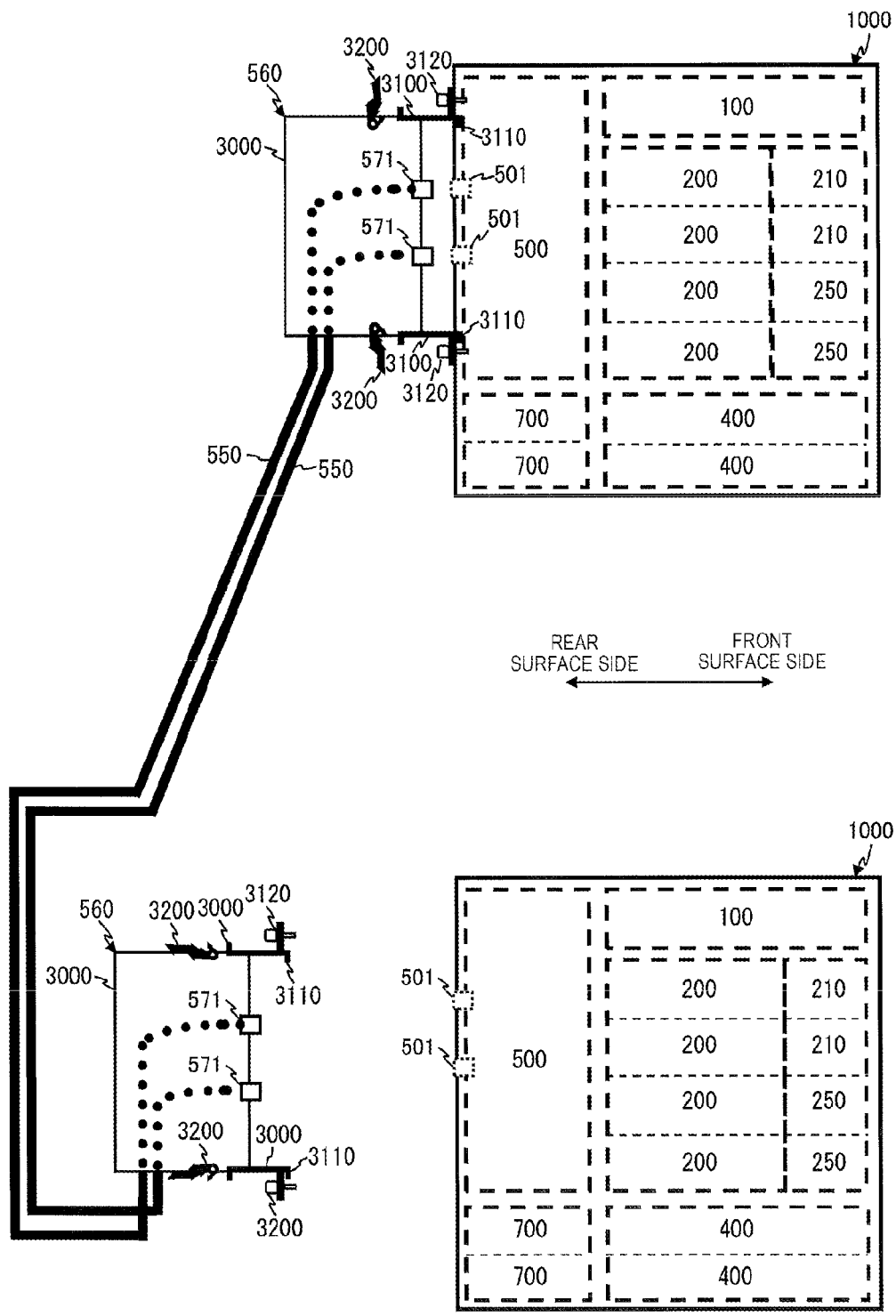
FIG. 6B is a diagram illustrating a state before the cartridge of Embodiment 1 being fixed to the communication apparatus and the main body section moving.

FIG. 6B is a diagram illustrating a state in which the cartridge 560 of Embodiment 1 is fixed to the communication apparatus 1000 and the main body section 3000 has yet to move.

The latching section 3110 of the guide rail 3100 of the cartridge 560 is inserted into the cartridge target opening 597 of the switch fabric unit 500. The latching section 3110, which has the L shape, is latched to the surface on the lower side, which forms the cartridge target opening 597, and the cartridge 560 is latched to the switch fabric unit 500. As described in FIGS. 3A to 3C, since the latching sections 3110 of the guide rails 3100, which are connected to the top surface side and the undersurface side of the main body section 3000, are arranged to be perpendicular to the guide-rail movement surface and are below the guide-rail movement surface, the lower side of the fitting surface of the main body section 3000 is inclined for closing to the rear surface direction of the switch fabric unit 500 and the latching section 3110 is inserted to the cartridge target opening 597.

After the latching section 3110 is inserted, the fitting surface of the main body section 3000 is to be parallel to the rear surface of the switch fabric unit 500, and a surface of the guide rail 3100 which forms an L shape with the latching section 3110 comes into contact with the surface on the lower side, which forms the cartridge target opening 597. In this state, the hole 3122 formed in the guide rail fixing surface 3121 illustrated in FIGS. 3A to 3C communicates with the cartridge fixing screw hole 596 illustrated in FIGS. 4A and 4B. The guide rail fixing screw 3123 is fastened to the cartridge fixing screw hole 596 through the hole 3122 using a screwdriver or the like, and thereby the guide rail 3100 is fixed to the switch fabric unit 500. Further, the connectors 571 of the main body section 3000 connected to the guide rail 3100 latched by the latching section 3110 are positioned at a fitting position at which the connecter 571 can fit to the another-communication-apparatus target connectors 501 in the vertical direction of the communication apparatus 1000.

Figure 6C:
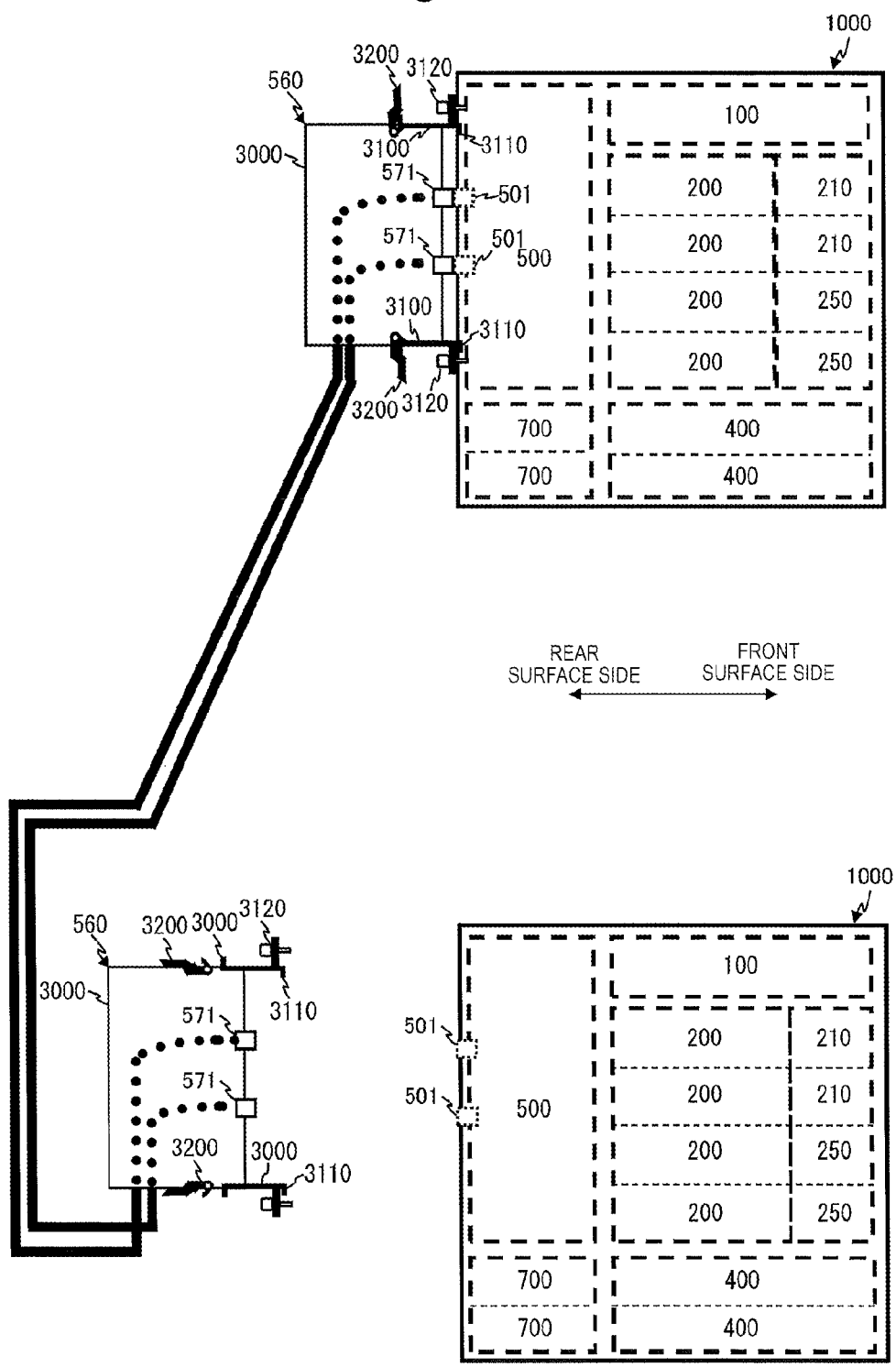
FIG. 6C is a diagram illustrating a state in which the main body section of Embodiment 1 moves and connectors are brought into contact with another-communication-apparatus target connectors.

FIG. 6C is a diagram illustrating a state in which the main body section 3000 of Embodiment 1 moves and connectors 571 contacts with another-communication-apparatus target connectors 501.

In FIG. 6B, the main body section 3000 is moved on the guide rail 3100 toward the switch fabric unit 500 side after the guide rail 3100 is fixed to the switch fabric unit 500.

To improve the fitting accuracy, a leading section (not illustrated), which leads one connector to the fitting position, is arranged in the other connector of the connector 571 and the another-communication-apparatus target connector 501. FIG. 6C illustrates a state. In the state, the main body section 3000 moves on the guide rail 3100, the connector 571 is brought into contact with the another-communication-apparatus target connector 501, and the other connector is led to the fitting position through the leading section. In the case of this state, the claw portion 3202 of the cartridge inserting-removing lever 3200 illustrated in FIG. 3A to 3C engages with the notch 3160 of the guide rail 3100 illustrated in FIG. 3C and FIG. 5.

FIG. 6D is a diagram illustrating a state in which the connectors 571 of Embodiment 1 are completely fitted to the another-communication-apparatus target connectors 501.

When the cartridge inserting-removing lever 3200 is turned to the rear surface direction of the main body section 3000 in the state of FIG. 6C, the claw portion 3202 of the cartridge inserting-removing lever 3200 engages with the notch 3160 illustrated in FIG. 3C and FIG. 5 and rotates. In this case, since the guide rail 3100 is fixed to the switch fabric unit 500, the main body section 3000 moves to the switch fabric unit 500 side due to the turn of the claw portion 3202, and the connectors 571 are completely fitted to the another-communication-apparatus target connectors 501. The connectors 571 of the inter-apparatus connecting electric cables 550 housed in the cartridge 560 are completely connected to the another-communication-apparatus target connectors 501 of the switch fabric unit 500.

Further, the attaching one cartridge 560 to one communication apparatus 1000 is described above with FIGS. 6A to 6D, and attaching the other cartridge 560 to the other communication apparatus 1000 is performed through the same procedure described above with FIGS. 6A to 6D.

As described above, it is possible to connect two communication apparatuses 1000 using two cartridges 560.

Further, reversing the procedure illustrated in FIGS. 6A to 6D allows the cartridge 560 to be removed from the communication apparatus 1000. Specifically, the cartridge inserting-removing lever 3200 is lifted from the state illustrated in FIG. 6D to the front surface direction of the main body section 3000, in other words, the cartridge 560 and the communication apparatus 1000 return to the state illustrated in FIG. 6C. Then, the main body section 3000 is moved to the side opposite to the switch fabric unit 500, in other words, the cartridge 560 and the communication apparatus 1000 return to the state illustrated in FIG. 6B. Then, the guide rail fixing screw 3123 is unscrewed, the guide rail 3100 is released from the switch fabric unit 500, and the latching section 3110 is detached from the cartridge target opening 597, in other words, the cartridge 560 and the communication apparatus 1000 return to the state illustrated in FIG. 6A. Accordingly, it is possible to remove the cartridge 560 from the communication apparatus 1000.

The latching section 3110 of the guide rail 3100 is described below with FIGS. 7A to 7C.

Figure 7A:
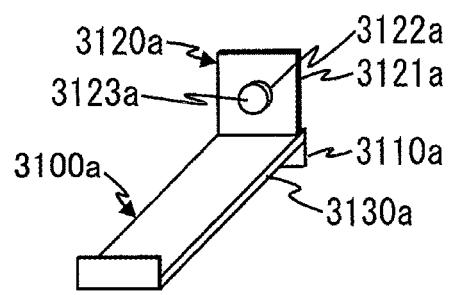
FIG. 7A is a perspective view of a guide rail which is attached to the top surface side of the main body section of Embodiment 1.

FIG. 7A is a perspective view of the guide rail 3100a, which is attached to the top surface side of the main body section 3000 of Embodiment 1. FIG. 7B is a top view of the guide rail 3100a of Embodiment 1. FIG. 7C is a left side view of the guide rail 3100a of Embodiment 1. The top surface of the guide rail 3100a is the surface positioned above the communication apparatus 1000 in the case where the guide rail 3100a is fixed to the communication apparatus 1000. The left surface of the guide rail 3100a is the surface positioned on the left side of the guide rail 3100a viewed from the front surface side of the communication apparatus 1000 in the case where the guide rail 3100a is fixed to the communication apparatus 1000.

The latching section 3110a is formed to be perpendicular to the guide-rail movement surface of the guide rail 3100a. In FIGS. 7A to 7C, since the latching section 3110a is formed by the end parts, which is a plate-shaped member, in the longitudinal direction of the guide rail 3100a being bent to be perpendicular to the guide-rail movement surface, the latching section 3110a has a plate shape.

Figure 7B:
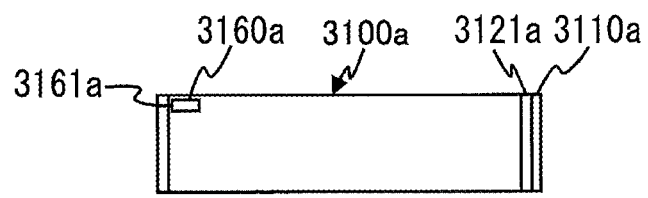
FIG. 7B is a top view of the guide rail of Embodiment 1.
Figure 7C:
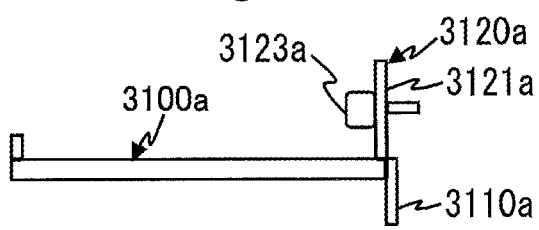
FIG. 7C is a left side view of the guide rail of Embodiment 1.

Further, the latching section 3110a illustrated in FIGS. 7A to 7C are the plate-shaped member, and the latching section 3110a may not formed by the guide rail 3100a being bent. For example, the plate-shaped member to be the latching section 3110a may be attached to the guide rail 3100a so as to be perpendicular to the guide-rail movement surface. In addition, since the latching section 3110b of the guide rail 3100b may be the same as the latching section 3110a, thus description thereof is omitted.

Next, a first modification example of this embodiment is described below with FIGS. 8A to 8C and FIG. 9. This modification example describes a case where the latching section 3110a is a rod-shaped integral pin member.

Figure 8A:
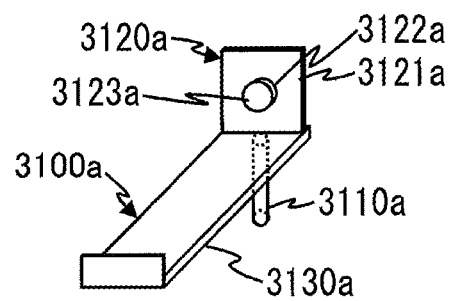
FIG. 8A is a perspective view of a guide rail which is attached to the top surface side of a main body section of a first modification example of Embodiment 1.
Figure 8B:
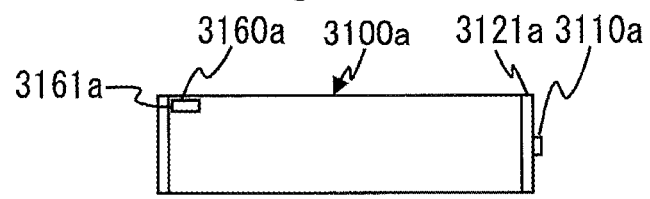
FIG. 8B is a top view of the guide rail of the first modification example of Embodiment 1.
Figure 8C:
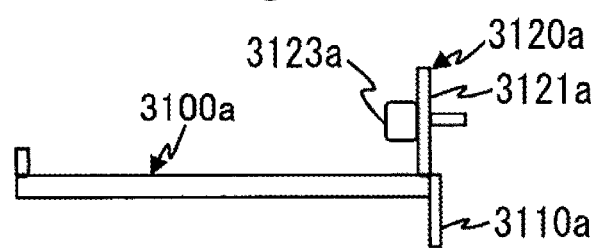
FIG. 8C is a left side view of the guide rail of the first modification example of Embodiment 1.

FIG. 8A is a perspective view of the guide rail 3100a of the first modification example of Embodiment 1. FIG. 8B is a top view of the guide rail 3100a of the first modification example of Embodiment 1. FIG. 8C is a left side view of the guide rail 3100a of Embodiment 1.

The rod-shaped (columnar) integral pin member to become the latching section 3110a is attached so that the longitudinal direction thereof is perpendicular to the guide-rail movement surface. Further, the latching section 3110b of the guide rail 3100b has the same configuration.

FIG. 9 is a rear view of the switch fabric unit 500 of the first modification example of Embodiment 1. The switch fabric unit 500 of this modification example differs from the switch fabric unit 500 illustrated in FIG. 4A in shapes of the cartridge target openings 597. In FIG. 4A, the cartridge target opening 597 has a rectangular shape whose longitudinal direction is the short direction of the switch fabric unit 500. In this modification example, the cartridge target opening 597 has substantially a rectangular shape whose longitudinal direction is the longitudinal direction of the switch fabric unit 500. The end portions are formed to be round in order for the latching section 3110, which is the rod-shaped pin member, to be inserted into both end parts of the cartridge target opening 597 of this modification example in the longitudinal direction.

Further, in this modification example, as with Embodiment 1, the upper side cartridge fixing screw hole 596 is formed at the position at which the distance between the undersurface of the upper side cartridge target opening 597 and the upper side cartridge fixing screw hole 596 equals to the distance between the guide-rail movement surface of the upper side guide rail 3100 and the center of the hole 3122. In addition, the lower side cartridge fixing screw hole 596 is formed at the position at which the distance between the undersurface of the lower side cartridge target opening 597 and the center of the lower side cartridge fixing screw hole 596 equals to the distance between undersurface of the lower side guide rail 3100 and the center of the lower side hole 3122.

According to the first modification example, it is possible to increase strength of the latching section 3110a. In other words, thickness of the latching section 3110a increases by having the rod shape instead of the plate shape. Therefore, strength against bending force increases, and higher attach accuracy is achieved.

Next, a second modification example of this embodiment is described below with FIGS. 10A and 10B, and FIG. 11. This modification example describes a case where the latching section 3110a consists of two rod-shaped pin members.

Figure 10A:
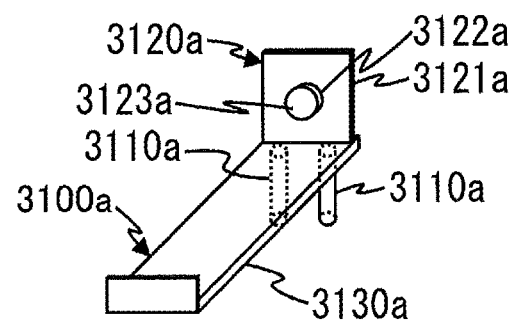
FIG. 10A is a perspective view of a guide rail of a second modification example of Embodiment 1.
Figure 10B:
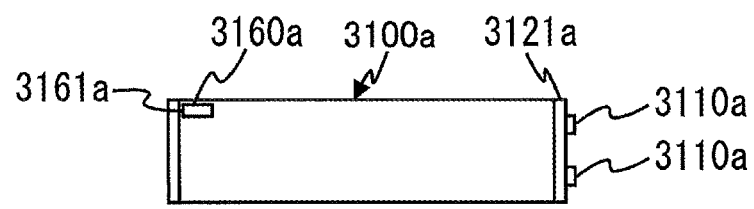
FIG. 10B is a top view of the guide rail of the second modification example of Embodiment 1.

FIG. 10A is a perspective view of the guide rail 3100a of the second modification example of Embodiment 1. FIG. 10B is a top view of the guide rail 3100a of the second modification example of Embodiment 1.

This modification example differs from the first modification example in that each of the latching section 3110a and the latching section 3110b consist of the two rod-shaped pin members.

Figure 11:
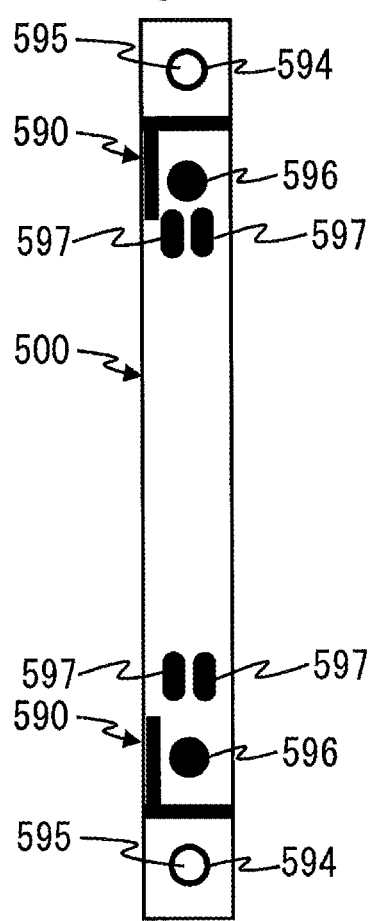
FIG. 11 is a rear view of a switch fabric unit of the second modification example of Embodiment 1.

FIG. 11 is a rear view of the switch fabric unit 500 of the second modification example of Embodiment 1. In this modification example, since each of the latching sections 3110a and 3110b consists of two pin members, two cartridge target openings 597 into which the latching section 3110a is inserted are formed, and two cartridge target openings 597 into which the latching section 3110b is inserted are formed. Further, the shapes of the respective cartridge target openings 597 is the same as that in the first modification example.

The number of the rod-shaped pin members to be the latching section 3110 is not limited to that of the first modification example and the second modification example. A designer may determine an optimal number of the pin members in consideration of a weight or the like of the main body section 3000.

The second modification example enables increasing the strength, as with the first modification example. In addition, the second modification example prevents turning around the latching section 3110a as a shaft since the latching section 3110a consists of the two shafts.

Next, a third modification example of Embodiment 1 is described below with FIGS. 12A and 12B, and FIG. 13. This modification example describes a separation type cartridge 560, in which the guide rail 3100 is not incorporated into the main body section 3000.

Figure 12A:
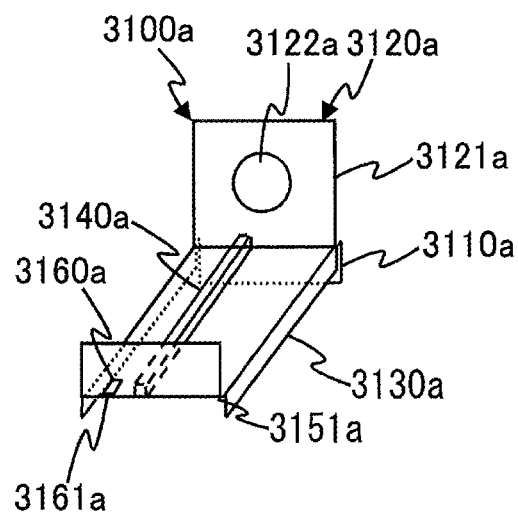
FIG. 12A is a perspective view of a guide rail which is attached to the top surface of a main body section of a third modification example of Embodiment 1.
Figure 12B:
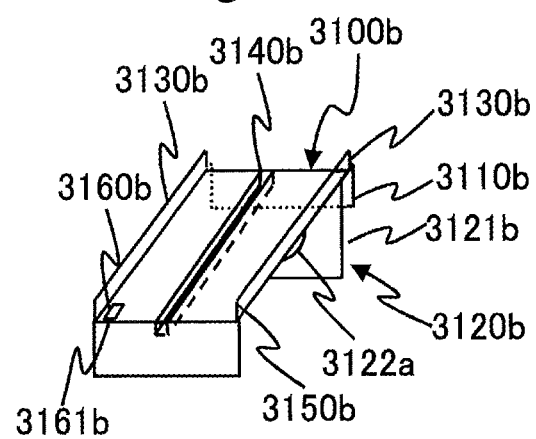
FIG. 12B is a perspective view of the guide rail which is attached to the undersurface of the main body section of the third modification example of Embodiment 1.

FIG. 12A is a perspective view of the guide rail 3100a which is attached to the top surface of the main body section 3000 of the third modification example of Embodiment 1. FIG. 12B is a perspective view of the guide rail 3100b which is attached to the undersurface of the main body section 3000 of the third modification example of Embodiment 1.

Since the guide rails 3100a and 3100b are not incorporated into the main body section 3000, there is no need to prevent the guide rails 3100a and 3100b from falling from the main body section 3000. Therefore, as illustrated in FIG. 12A, the guide rail 3100a does not have the fall preventing claw portion 3150a, and, as illustrated in FIG. 12B, the guide rail 3100b does not have the fall preventing claw portion 3150b. Since the configurations except for the above description of the guide rails 3100a and 3100b are the same as that of Embodiment 1, description thereof is omitted.

Figure 13:
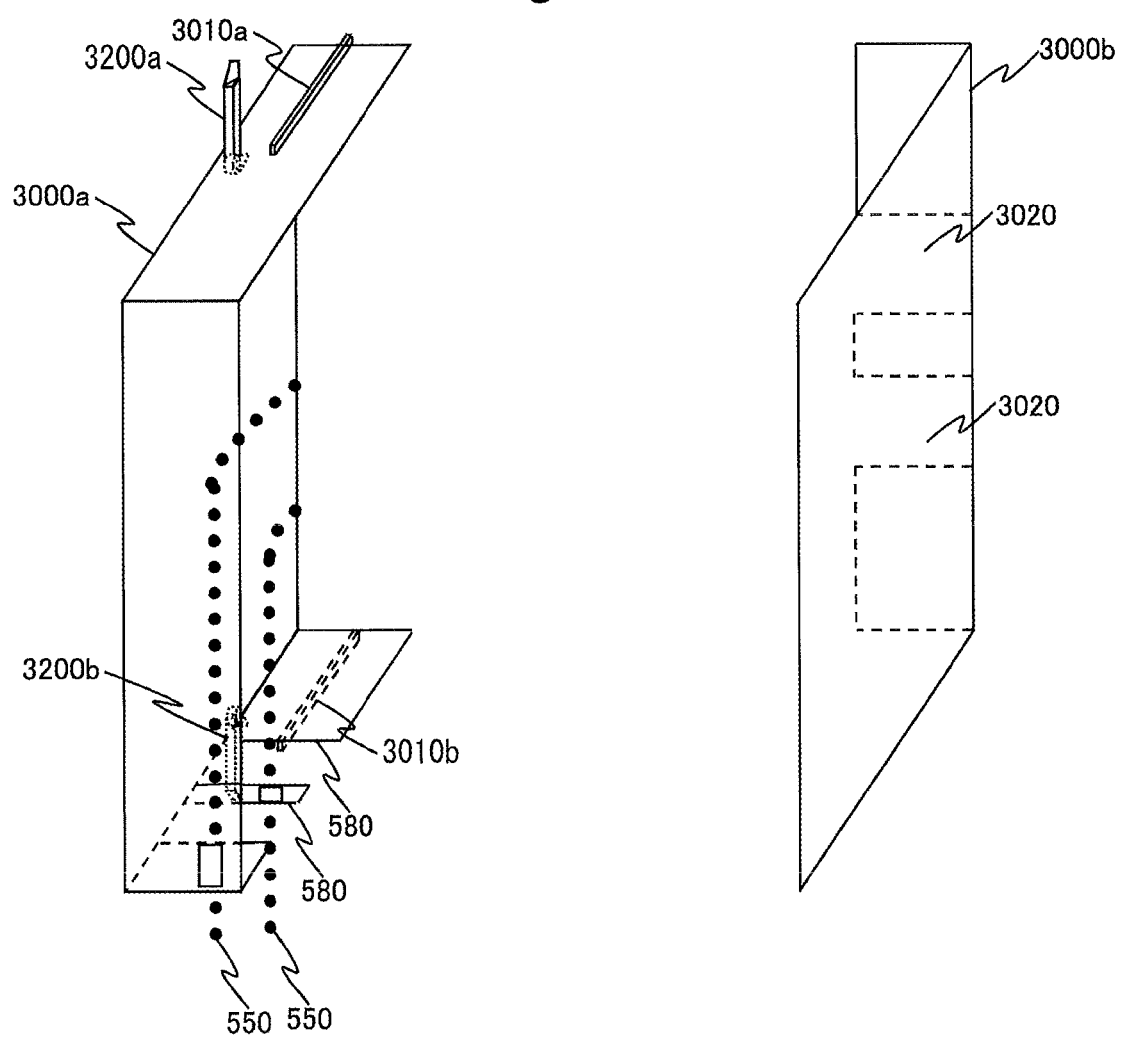
FIG. 13 is an exploded perspective view of the main body section of the third modification example of Embodiment 1.

FIG. 13 is an exploded perspective view of the main body section 3000 of the third modification example of Embodiment 1.

In the Embodiment 1, as illustrated in FIG. 5, the guide rail assistant portion 3130 of the guide rail 3100 is incorporated into the main body section 3000, and the notches 3031 and 3032 are formed in the main body section metal plate 3000b so that the guide rail assistant portion 3130 cannot come into contact with the main body section metal plate 3000b in a case where the main body section 3000 moves on the guide rail 3100. However, in this modification example, since the guide rail 3100 is not incorporated into the main body section 3000, the notches 3031 and 3032 are not formed in the main body section metal plate 3000b.

In this modification example, after the latching sections 3110 of the respective guide rails 3100a and 3100b are inserted and the respective guide rails 3100a and 3100b are fixed to the switch fabric unit 500, the rails 3010a and 3010b of the main-body-section movement surface are inserted so as to be fitted to the rails 3140a and 3140b of the guide-rail movement surface, and thereby the main body section 3000 and the guide rail 3100 are connected. By the main body section 3000 moving to a predetermined position on the guide rails 3100a and 3100b and the cartridge inserting-removing lever 3200 being operated, the connectors 571 of the main body section 3000 are fitted to the another-communication-apparatus target connectors 501 of the switch fabric unit 500. The cartridge inserting-removing lever 3200 is operated, and thereby the main body section 3000 and the guide rails 3100a and 3100b are fixed.

The third modification example improves operability of the fixing. In other words, according to the third modification example, the cartridge 560 is separated, and there is no need to support the cartridge 560 when the guide rail 3100 is fixed to the switch fabric unit 500. Thus, since only the guide rail 3100 may be supported, it is easy to attach.

Next, a fourth modification example of Embodiment 1 will be described with reference to FIGS. 14A and 14B. In the present modification example, an example, in which the attachment position of the cartridge inserting-removing lever 3200 to the main body section 3000 is altered in the rear surface direction of the main body section 3000 and the guide section 580, which guides the inter-apparatus connecting electric cable 550 to the outside, is formed on the rear surface of the main body section 3000, is described.

Figure 14A:
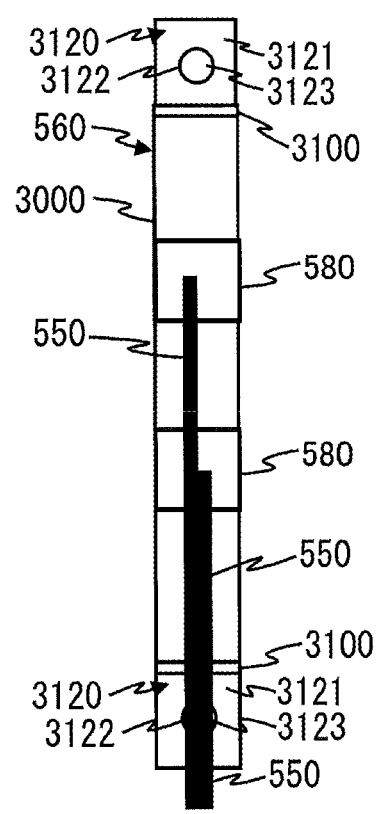
FIG. 14A is a rear view of a cartridge of a fourth modification example of Embodiment 1.

FIG. 14A is a rear view of the cartridge 560 of the fourth modification example of Embodiment 1. In Embodiment 1, as illustrated in FIG. 2 and FIG. 5, the guide section 580 is formed in the bottom of the main body section 3000. However, in the present modification example, as illustrated in FIG. 14A, the guide section 580 is formed on the rear surface of the main body section 3000.

A position at which the guide section 580 is formed is not limited to the bottom and the rear surface of the main body section 3000. A designer may determine an optimal position of the guide section 580 on the main body section 3000 in consideration of a space or the like on which the communication apparatus 1000 is arranged.

Figure 14B:
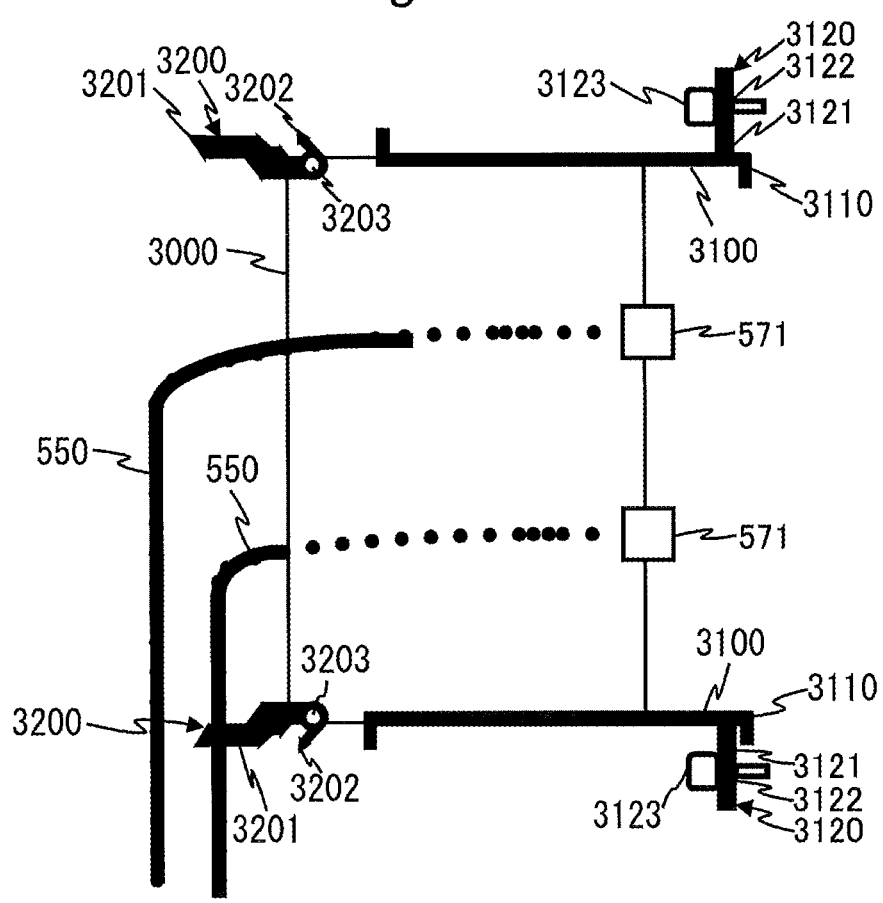
FIG. 14B is a diagram illustrating the cartridge of the fourth modification example of Embodiment 1 viewed from the left side.

FIG. 14B is a diagram illustrating the cartridge 560 of the fourth modification example of Embodiment 1 viewed from the left side. Further, in FIG. 14B, a part at which the cartridge inserting-removing lever 3200 is positioned inside the main body section 3000 is not actually viewed on the left surface of the cartridge 560, but the part is illustrated in the drawing for description. In Embodiment 1, as illustrated in FIG. 3B, the cartridge inserting-removing lever 3200 is attached in the vicinity of the center of the top surface and the undersurface of the main body section 3000 but, in this modification example, as illustrated in FIG. 14B, the cartridge inserting-removing lever is attached in the vicinity of end parts of the top surface and the undersurface of the main body section 3000 on the rear surface side of the main body section 3000. In a case where a user inserts the cartridge 560 into the communication apparatus 1000, the user performs the operation from the rear surface side of the cartridge 560. Therefore, the position of the cartridge inserting-removing lever 3200 is close to the position at which the user performs the operation, and the operability for the user is improved.

In addition, the cartridge inserting-removing lever 3200 is attached on the rear surface side of the main body section 3000, and thereby the position with which the claw portion 3202 can engage moves toward the rear surface side of the main body section 3000. Therefore, there is a need to lengthen the longer sides of the guide-rail movement surface of the guide rail 3100 by length from the attachment position of the cartridge inserting-removing lever 3200 of Embodiment 1 to the attachment position of the cartridge inserting-removing lever 3200 of the present modification example. Accordingly, the length of the longer side of the guide-rail movement surface of the guide rail 3100 in this modification example is greater than the length of the longer side of the guide-rail movement surface in Embodiment 1. There is a need to lengthen the rails 3010a and 3010b, and the rails 3140a and 3140b, depending on lengthening the longer sides of the guide-rail movement surface.

Embodiment 2

Embodiment 1 describes the cartridge 560 connected to the switch fabric unit 500 disposed to have the longitudinal direction thereof in the vertical direction of the communication apparatus 1000. This embodiment describes the cartridge 560 connected to the switch fabric unit 500 arranged to have the longitudinal direction thereof in the right/left direction of the communication apparatus 1000.

Figure 15:
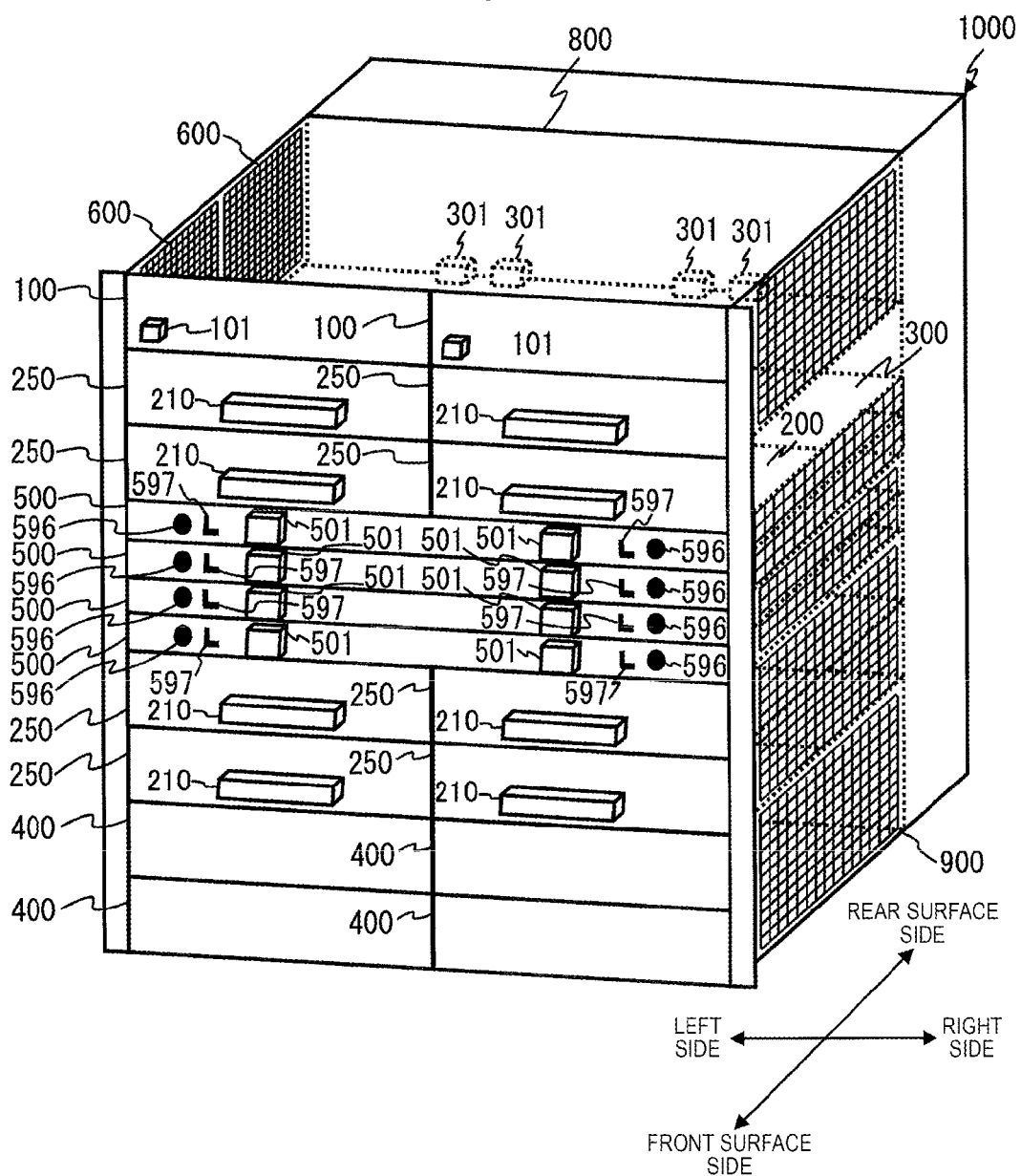
FIG. 15 is a perspective view on the front surface side of a communication apparatus of Embodiment 2.

FIG. 15 is a perspective view on the front surface side of the communication apparatus 1000 of Embodiment 2.

The communication apparatus 1000 of this embodiment have a right/left inhale/exhaust structure, in which cooling air flows in the right-left direction, and does not have a front inhale/rear-exhaust structure in Embodiment 1. Therefore, the vent 900 is arranged on the right surface of the communication apparatus 1000, and the FAN unit 600 is arranged on the left surface. In the right/left inhale/exhaust structure, it is required that the switch fabric unit 500 is arranged to have the longitudinal direction in the right/left direction of the communication apparatus 1000 in order for the switch fabric unit 500 not to interfere the flow of the cooling air. The arrangement of the switch fabric unit 500 whose longitudinal direction is the vertical direction of the communication apparatus 1000 is referred to as a vertical arrangement. The arrangement of the switch fabric unit 500 whose longitudinal direction is the right-left direction of the communication apparatus 1000 is referred to as a horizontal arrangement.

The substrate arranged on the front surface of the backplane 800 and the substrate arranged on the rear surface have to have a perpendicular relationship. The arrangement of the substrate arranged on the front surface of the backplane 800 is typically the horizontal arrangement. The arrangement of substrate arranged on the rear surface is typically the vertical arrangement. Therefore, in the communication apparatus 1000 illustrated in FIG. 15, the switch fabric unit 500 is horizontally arranged on the front surface of the backplane 800. Accordingly, in the communication apparatus 1000 illustrated in FIG. 15, the another-communication-apparatus target connectors 501 are arranged on the front surface of the communication apparatus 1000, and thereby the communication apparatus 1000 is connected, in the non-blocking connection manner, to another communication apparatus 1000 through the another-communication-apparatus target connectors 501 and the inter-apparatus connecting electric cable 550 which are arranged on the front surface.

Further, in a case where the substrate arranged on the front surface of the backplane 800 does not have to perpendicular to and the substrate arranged on the rear surface, the switch fabric unit 500 may be horizontally arranged on the rear surface of the communication apparatus 1000.

Further, the number of the mounted switch fabric units 500 and the number of the another-communication-apparatus target connectors 501 are not limited to the numbers illustrated in FIG. 15.

Next, the cartridge 560 connected to the switch fabric unit 500 which is horizontally arranged is described below with FIGS. 16A to 16C.

Figure 16A:
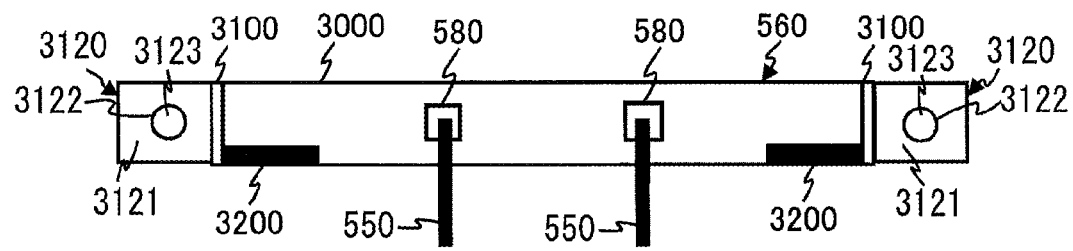
FIG. 16A is a rear view of a cartridge of Embodiment 2.

FIG. 16A is a rear view of the cartridge 560 of Embodiment 2. FIG. 16B is a diagram illustrating the cartridge of Embodiment 2 viewed from above. FIG. 16C is a right side view of the guide rail 3100 which is attached to the right surface side of the cartridge 560 of Embodiment 2. Further, in FIG. 16B, a part of the cartridge inserting-removing lever 3200 positioned inside the main body section 3000 is not actually viewed on the top surface of the cartridge 560, but the part is illustrated in the drawing for description.

Figure 16B:
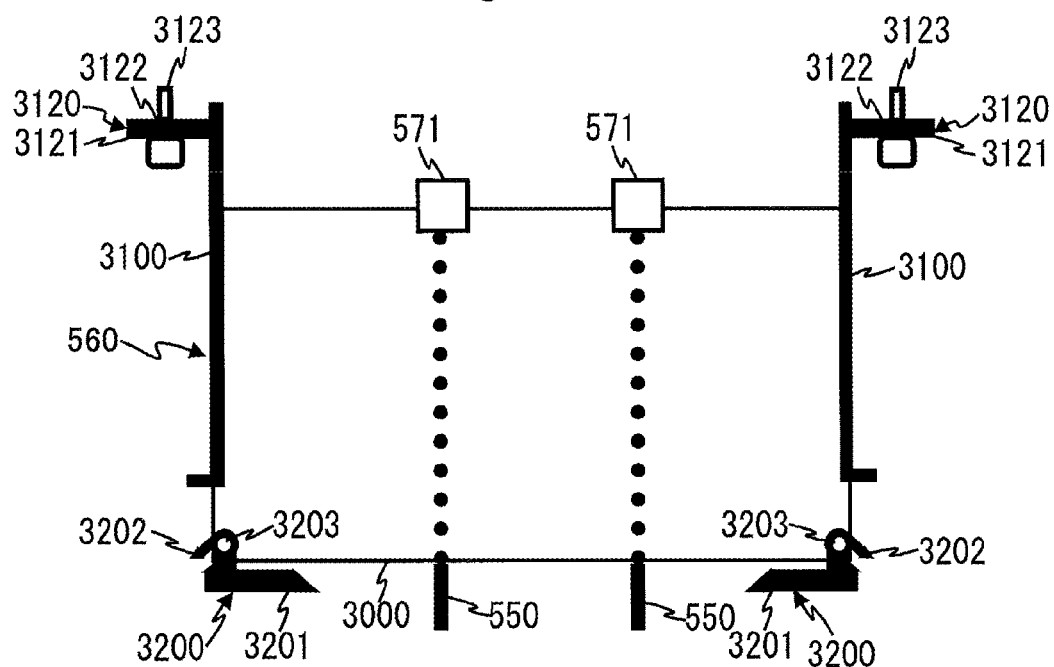
FIG. 16B is a diagram illustrating the cartridge of Embodiment 2 viewed from above.
Figure 16C:
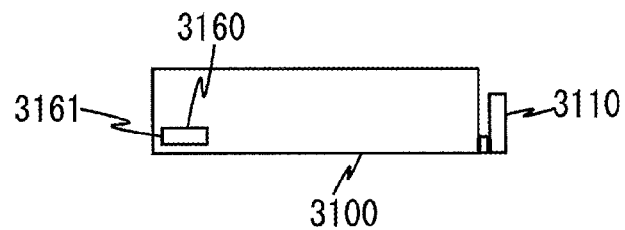
FIG. 16C is a right side view of a guide rail attached to a right surface side of the cartridge of Embodiment 2.

As illustrated in FIG. 16B, the cartridge 560 has the main body section 3000, the guide rail 3100, and the cartridge inserting-removing lever 3200.

Unlike in the Embodiment 1, the guide rail 3100 is connected to the right surface side and the left surface side of the main body section 3000. The guide rail 3100 has the latching section 3110 and the guide rail fixing section 3120.

Surfaces of the guide rail 3100 which face the right surface and the left surface of the main body section 3000 become the guide-rail movement surfaces. The right surface and the left surface of the main body section 3000 become the main-body-section movement surfaces. The guide rail assistant portion 3130 illustrated in FIG. 18 is arranged to be upright from the side of the guide-rail movement surface on the undersurface side of the main body section 3000. The guide rail assistant portion 3130 comes into contact with the undersurface of the main body section 3000. As illustrated in FIG. 16C, the latching section 3110 is a rod-shaped member which is arranged to be upright from the end part of the guide rail assistant portion 3130 of the guide rail 3100 on the communication apparatus 1000 side. The latching section 3110 is inserted into the cartridge target opening 597 having the L shape on the front surface of the switch fabric unit 500 illustrated in FIG. 17B. When the cartridge 560 moves to the right direction in a state in which the latching section 3110 is inserted into the cartridge target opening 597, the latching section 3110 comes into contact with the wall surface forming the cartridge target opening 597, and the main body section 3000 is latched on the switch fabric unit 500. In addition, as with Embodiment 1, the latching section 3110 can absorb force which is generated by the operation of the cartridge inserting-removing lever 3200 and which moves the guide rail 3100 to the rear surface direction and prevent the guide rail 3100 from being deformed. Further, since the guide rail fixing section 3120 is the same in that of Embodiment 1, description thereof is omitted.

The cartridge inserting-removing lever 3200 is attached to the right surface side and the left surface side of the rear surface of the main body section 3000. Further, since a configuration of the cartridge inserting-removing lever 3200 is the same as in Embodiment 1, description thereof is omitted.

Figure 17A:
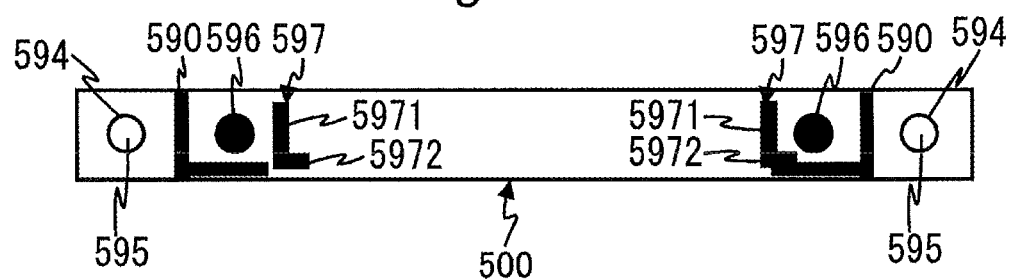
FIG. 17A is a front view of a switch fabric unit of Embodiment 2.
Figure 17B:
FIG. 17B is a diagram illustrating the switch fabric unit of Embodiment 2 viewed from above.

Next, the switch fabric unit 500 is described below with FIGS. 17A and 17B. FIG. 17A is a front view of the switch fabric unit 500 of Embodiment 2. FIG. 17B is a diagram illustrating the switch fabric unit 500 of Embodiment 2 viewed from the top surface. Further, in FIG. 17B, a part of the switch fabric unit inserting-removing lever 590 positioned inside the switch fabric unit 500 is not actually viewed on the top surface of the switch fabric unit 500, but the position is illustrated in the drawing for description.

The switch fabric unit fixing holes 594, the cartridge fixing screw holes 596, and the cartridge target openings 597 are formed on the front surface side of the housing of the switch fabric unit 500. In addition, the turning shafts 504 are arranged on the front surface side of the housing of the switch fabric unit 500. The switch fabric unit inserting-removing lever 590 is turnably attached to the turning shaft 504.

The switch fabric unit fixing holes 594 are formed on the right end and the left end of the front surface of the switch fabric unit 500, on the other hand, the switch fabric unit fixing holes 594 of Embodiment 1 are formed on the upper end and the lower end of the rear surface of the switch fabric unit 500, in that the switch fabric unit fixing hole. The switch fabric unit 500 is fixed to the communication apparatus 1000 through the switch fabric unit fixing hole 594 and the switch fabric unit fixing screw 595.

Next, the cartridge target opening 597 is described below.

The cartridge target opening 597 of this embodiment has the L shape. The cartridge target opening 597 has a latching section inserting opening 5971 and latching section moving opening 5972. The latching section inserting opening 5971 is an opening whose longitudinal direction is the short direction, (or vertical direction of the communication apparatus 1000) of the switch fabric unit 500, and the latching section 3110 is inserted into the latching section inserting opening 5971. The latching section moving opening 5972 is an opening which is opened toward the right side of the communication apparatus 1000 from the lower end of the latching section inserting opening 5971. When the latching section 3110 inserted into the latching section inserting opening 5971 moves to the right along the latching section moving opening 5972, the latching section 3110 comes into contact with the wall surface forming the latching section moving opening 5972, and the latching section 3110 latches the guide rail 3100 on the communication apparatus 1000.

A length of the latching section inserting opening 5971 in the vertical direction of the communication apparatus 1000 is an enough length with which the latching section 3110 is inserted. In addition, the length of the latching section moving opening 5972 in the vertical direction of the communication apparatus 1000 is shorter than the length of the latching section 3110. Therefore, in a case where the latching section 3110 moves to the right inside the latching section moving opening 5972 in a state in which the latching section 3110 is inserted into the latching section inserting opening 5971, the latching section 3110 comes into contact with the wall surface of the switch fabric unit 500 which forms the latching section moving opening 5972, and the guide rail 3100 is latched on the switch fabric unit 500. It is preferable that the length of the latching section moving opening 5972 in the vertical direction of the communication apparatus 1000 substantially equals to the thickness of the guide rail assistant portion 3130 of the guide rail 3100.

Next, the cartridge fixing screw hole 596 is described below.

The cartridge fixing screw hole 596 is formed at a position at which the cartridge fixing screw hole communicates with the hole 3122 in a state in which the guide rail 3100 moves to a position at which the latching section 3110 comes into contact with the right end portion of the latching section moving opening 5972 of the cartridge target opening 597. In other words, the cartridge fixing screw hole 596 is formed at the position at which the distance between the center of the cartridge fixing screw hole 596 and the right end portion of the latching section moving opening 5972 equals to the distance between the center of the hole 3122 and the position at which the latching section 3110 comes into contact with the right end portion of the latching section moving opening 5972.

FIG. 18 is an exploded perspective view of the cartridge of Embodiment 2.

As with Embodiment 1, the guide rail 3100 of this embodiment is incorporated into the main body section 3000 in assembling the cartridge 560. The main body section metal plate 3000*a* has surfaces which become the undersurface, the right surface, the left surface, and the rear surface of the main body section 3000. The main body section metal plate 3000*b* has surfaces which become the top surface and the front surface of the main body section 3000. The main body section metal plates 3000*a* and 3000*b* are assembled so that the main body section metal plate 3000*b* can cover the main body section metal plate 3000*a* to which the inter-apparatus connecting electric cable 550 is fixed. The guide section 580 is formed on the rear surface of the main body section metal plate 3000*a*, and the notch 3020 is formed on the front surface of the main body section metal plate 3000*b*.

The rail 3010*a* and a hole (not illustrated) are formed in the left surface of the main body section metal plate 3000*a*. In addition, the rail 3010*b* and a hole (not illustrated) are formed in the right surface of the main body section metal plate 3000*a*. The cartridge inserting-removing lever 3200*a* is attached to the left surface side of the rear surface of the main body section metal plate 3000*a*. The claw portion 3202 of the cartridge inserting-removing lever 3200*a* through the hole protrudes from the main-body-section movement surface. In addition, the cartridge inserting-removing lever 3200*b* is attached to the right surface side of the rear surface of the main body section metal plate 3000*a* and the claw portion 3202 of the cartridge inserting-removing lever 3200*b* through the hole protrudes from the main-body-section movement surface.

Before the main body section metal plates 3000*a* and 3000*b* are assembled, the guide rails 3100*a* and 3100*b* are attached to the right surface and the left surface of the main body section metal plate 3000*a*.

As with Embodiment 1, the guide rail 3100*a* has a latching section 3110*a*, a guide rail fixing section 3120*a*, a guide rail fixing surface 3121*a*, a hole 3122*a*, a guide rail assistant portion 3130*a*, a rail 3140*a*, a fall preventing claw portion 3150*a*, and a notch 3160*a*. Similarly, the guide rail 3100*b* has a latching section 3110*b*, a guide rail fixing section 3120*b*, a guide rail fixing surface 3121*b*, a hole 3122*b*, a guide rail assistant portion 3130*b*, a rail 3140*b*, a fall preventing claw portion 3150*b*, and a notch 3160*b*.

The rail 3140*a* extends in the guide-rail movement surface of the guide rail 3100*a* across the longitudinal direction of the guide-rail movement surface. In addition, the guide rail assistant portion 3130*a* is arranged to be upright and perpendicular to the guide-rail movement surface from two sides of the guide-rail movement surface in the short direction toward the main body section 3000 side. The guide rail assistant portion 3130*a* is a surface to which is perpendicular to the main-body-section movement surface. The guide rail assistant portion 3130*a* (top surface side guide rail assistant portion 3130*a*) is arranged on the top surface side of the main body section 3000 to be upright from a part of one side of the guide-rail movement surface on the communication apparatus 1000 side. The guide rail assistant portion 3130*a* (undersurface side guide rail assistant portion 3130*a*) is arranged on the undersurface side of the main body section 3000 to be upright across the entire side of the other side of the guide-rail movement surface.

The fall preventing claw portion 3150*a* is arranged on the top surface side guide rail assistant portion 3130*a*. Specifically, the fall preventing claw portion 3150*a* is arranged from the top surface side guide rail assistant portion 3130*a* toward the undersurface side guide rail assistant portion 3130*a* side. The notch 3151*a* is arranged between the fall preventing claw portion 3150*a* and the guide-rail movement surface. The notches 3151*a* has a thickness greater than the thickness of the metal plate of the left surface of the main body section metal plate 3000*a* so that the left surface of the main body section metal plate 3000*a* can pass through between the fall preventing claw portion 3150*a* and the guide-rail movement surface.

Further, similarly, the guide rail assistant portion 3130*b*, the fall preventing claw portion 3150*b*, and the notch 3151*b* are arranged on the guide rail 3100*b*.

The guide rails 3100*a* and 3100*b* are moved so that the fall preventing claw portions 3150*a* and 3150*b* can be positioned inside the main body section metal plate 3000*a* in a state in which the rails 3140*a* and 3140*b* of the guide rails 3100*a* and 3100*b* are fitted to the rails 3140*a* and 3140*b* of the main body section metal plate 3000*a*. In a state in which the fall preventing claw portions 3150*a* and 3150*b* are positioned inside the main body section metal plate 3000*a*, the main body section metal plate 3000*b* is assembled in the main body section metal plate 3000*a*. Even when the guide rails 3100*a* and 3100*b* move, the fall preventing claw portions 3150*a* and 3150*b* come into contact with the front surface of the main body section metal plate 3000*b*. Therefore, it is possible to prevent the guide rails 3100*a* and 3100*b* from falling from the main body section 3000.

The rod-shaped latching sections 3110*a* and 3110*b* are arranged on the undersurface side guide rail assistant portions 3130*a* and 3130*b* to be upright. Specifically, the latching sections 3110*a* and 3110*b* are arranged on the communication apparatus 1000 side from the guide rail fixing sections 3120*a* and 3120*b*. Specifically, the guide-rail movement surface is terminated at the position at which the guide rail fixing surfaces 3121*a* and 3121*b* are formed, but the undersurface side guide rail assistant portions 3130*a* and 3130*b* extend to the communication apparatus 1000 side from the end position of the guide-rail movement surface. The latching sections 3110*a* and 3110*b* are arranged to be upright at the end portion of a portion on the communication apparatus 1000 side in which the undersurface side guide rail assistant portions 3130*a* and 3130*b* extend and to be perpendicular to a surface which becomes the undersurface side guide rail assistant portions 3130*a* and 3130*b* in the direction of the top surface side guide rail assistant portions 3130*a* and 3130*b*.

The distance between the latching sections 3110*a* and 3110*b* and the guide rail fixing surfaces 3121*a* and 3121*b* is the thickness of the surface forming the cartridge target opening 597 of the switch fabric unit 500. Specifically, the distance between the surface which comes into contact with the surface forming the cartridge target opening 597 of the latching sections 3110a and 3110b and the guide rail fixing surfaces 3121a and 3121b is the thickness of the surface forming the cartridge target opening 597. Accordingly, since a gap is not formed between the guide rail fixing surfaces 3121a and 3121b and the latching sections 3110a and 3110b, it is possible to prevent the guide rail fixing surface 3121 from distorting in a case where the guide rail fixing screw 3123 is fastened to the communication apparatus 1000.

As described above, it is possible to provide a cartridge 560 corresponding to the communication apparatus 1000 in which the switch fabric unit 500 whose longitudinal direction is the right-left direction of the communication apparatus 1000 is arranged.

Next, a modification example of Embodiment 2 is described below with FIG. 19. This modification example describes the separation type cartridge 560, in which the guide rail 3100 is not incorporated into the main body section 3000.

Figure 19:
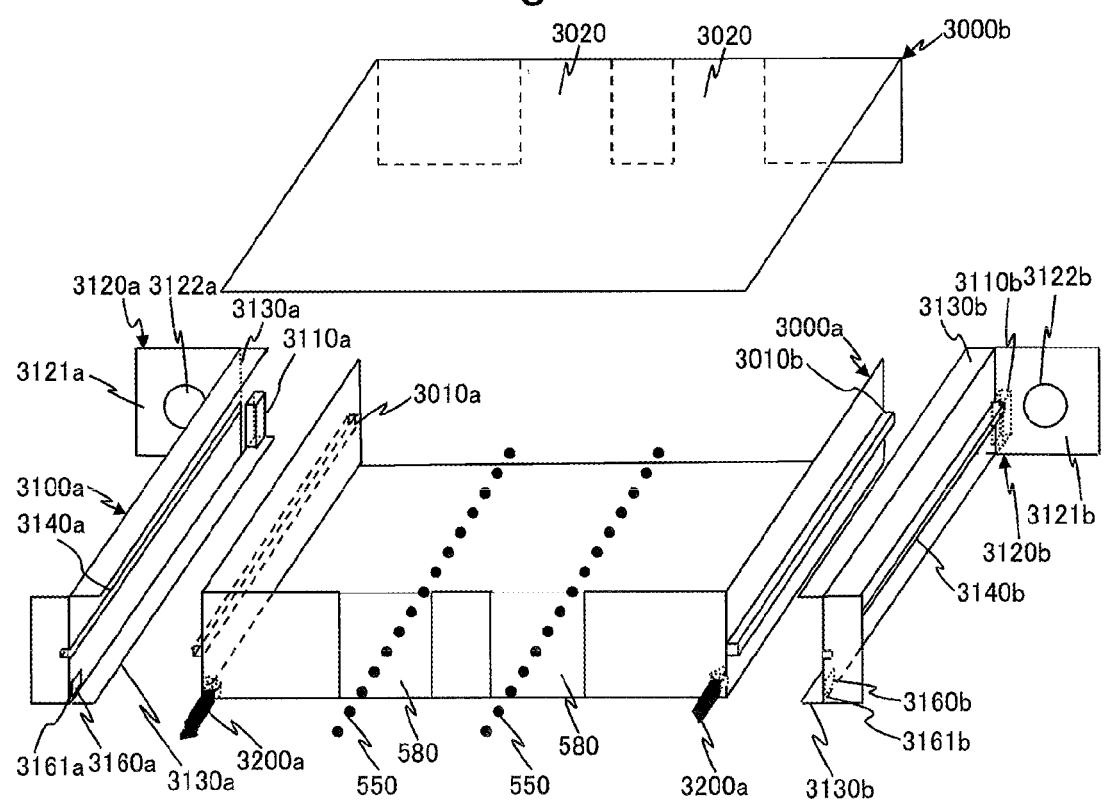
FIG. 19 is an exploded perspective view of a cartridge of a modification example of Embodiment 2.

FIG. 19 is an exploded perspective view of the cartridge 560 of the modification example of Embodiment 2. Since the guide rails 3100a and 3100b are not incorporated into the main body section 3000, the guide rails 3100a and 3100b do not have the fall preventing claw portions 3150a and 3150b and the notches 3151a and 3151b. The top surface side guide rail assistant portions 3130a and 3130b are arranged to be upright on the entire side of the side of the guide-rail movement surface in the longitudinal direction, as with the undersurface side guide rail assistant portions 3130a and 3130b. The guide rail assistant portion 3130a of the guide rails 3100a and the guide rail assistant portion 3130b of the guide rail 3100b hold the main body section 3000 by interposing the main body section 3000 between them.

Further, in Embodiment 1 and Embodiment 2, a speed converting circuit is mounted in the communication apparatus 1000, and thereby it is possible to reduce the number of the inter-apparatus connecting electric cables 550. In addition, an electricity and beam converting circuit is mounted in the communication apparatus 1000, and thereby it is possible to elongate a transmission distance of the inter-apparatus connecting electric cable 550.

Effects of Embodiment 1 and Embodiment 2 are described below.

The connector housing apparatus (cartridge 560) includes: a main body section (main body section 3000) that has a plurality of connectors (connectors 571) confronting a plurality of external connectors (another-communication-apparatus target connectors 501) which an external housing (communication apparatus 1000) has; and a moving guide section (guide rail 3100) that guides movement of the main body section toward the external housing. The moving guide section has a latching section that latches the moving guide section on the external housing. The main body section is connected to the moving guide section so as to be movable in a fitting direction of the plurality of connectors in a state in which the moving guide section is latched on the external housing by the latching section. The latching section latches the moving guide section on a position at which the plurality of connectors are fitted to the plurality of external connectors in a case where the main body section connected to the moving guide section moves along the moving guide section. The main body section moves along the moving guide section in the fitting direction of the plurality of connectors, and thereby the plurality of connectors are fitted to the plurality of external connectors.

Accordingly, it is possible for a user to attaching the connector housing apparatus from the outside of the external housing and to collectively fit the plurality of connectors, from the outside of the housing, to the plurality of external connectors which the external housing has. In addition, since the moving guide section is latched on a position at which the plurality of connectors are fitted to the plurality of external connectors before the main body section is moved, it is possible to adjust the fitting position of the connectors of the main body section to the external connectors before the main body section is moved. Accordingly, it is possible to achieve higher fitting accuracy of the connectors and external connectors. Further, even if the moving guide section is not supported in order for the moving guide section not to fall the moving guide section from the external housing, it is possible to prevent falling the moving guide section from the external housing.

In addition, the moving guide section has a moving-guide-section fixing portion (guide rail fixing section 3120) that fixes, to the external housing, the moving guide section latched on the external housing. Accordingly, since the moving guide section can be fixed to the external housing, there is no need to support the moving guide section in a case where a user moves the main body section.

In addition, the latching section is provided closer to the external housing side than the moving-guide-section fixing portion. The moving guide section is locked to the external housing by the latching section, and then it is possible to fix the moving guide section to the external housing by the moving-guide-section fixing portion. Therefore, it is possible to prevent the moving guide section from falling from the external housing before the moving guide section is fixed to the external housing.

In addition, the main body section has a fitting surface on which the plurality of connectors are arranged and which confronts a surface of the external housing on which the plurality of external connectors are arranged. The moving-guide-section fixing portion has a moving-guide-section fixing screw (guide rail fixing screw 3123) and a moving-guide-section fixing surface (guide rail fixing surface 3121), which is a surface parallel to the fitting surface of the main body section connected to the moving guide section. The moving-guide-section fixing surface has a hole (hole 3122). The hole communicates with a screw hole (cartridge fixing screw hole 596) on the external housing in a case where the moving guide section is latched on the external housing by the latching section. By the moving-guide-section fixing screw being fastened through the hole to a screw hole communicating with the hole, the moving guide section is fixed to the external housing.

Accordingly, since the moving guide section is fastened to the external housing by the moving-guide-section fixing screw, it is possible to reliably fix the moving guide section to the external housing.

In addition, the latching section is inserted into a latching-portion target hole (cartridge target opening 597) on the external housing. The latching section inserted into the locking-portion target hole comes into contact with a surface on which the latching-portion target hole is, and thereby the latching section latches the moving guide section on the external housing. A distance between the moving-guide-section fixing surface and the latching section is the thickness of the surface of the external housing which latches the latching section. Accordingly, since a gap is not formed between the moving-guide-section fixing surface and the latching section, it is possible to prevent the moving-guidesection fixing surface from distorting in a case where the moving-guide-section fixing screw is fastened to the external housing.

An inserting-removing lever (cartridge inserting-removing lever 3200) is turnably attached to the main body section. The inserting-removing lever has a claw portion (claw portion 3202) protruding from a main-body-section movement surface, which is a surface of the main body section on which the moving guide section moves. A moving-guide-section movement surface, which is a surface of the moving guide section on which the main body section moves, has a notch (notch 3160), with which the claw portion, in a case where the main body section reaches a predetermined position of the moving guide section, protruding from a main-body-section movement surface engages. In a case where the claw portion engages with the notch, after the inserting-removing lever is turned, the main body section moves the moving guide section toward the external housing side and the plurality of connectors are completely fitted to the plurality of external connectors. Accordingly, it is possible to improve the fitting accuracy because the plurality of connectors are completely fitted to the plurality of external connectors by the main body section being moved by the inserting-removing lever being turned.

In addition, the moving guide section has a moving-guide-section fixing portion, which fixes the moving guide section to the external housing. A distance between the latching section and the moving-guide-section movement surface on which the notch is is less than a distance between the moving-guide-section movement surface and a position at which the moving-guide-section fixing portion fixes the moving guide section. Accordingly, since the latching section which is close to the moving-guide-section movement surface on which the notch is arranged can absorb the force which acts on the notch due to the turn of the inserting-removing lever, it is possible to prevent the moving-guide-section fixing portion from being deformed.

In addition, respective a main-body-section movement surface, which is a surface of the main body section on which the moving guide section moves, and a moving-guide-section movement surface, which is a surface of the moving guide section on which the main body section moves have rails (rails 3010 and 3140) which extend toward the external housing side. The rails are fitted to each other. The rails regulate movement of the main body section in directions except for a direction in which the rails extend. The main body section is connected to the moving guide section by rails being fitted to each other. Accordingly, the rails are fitted to each other, and thereby it is possible for the main body section to be connected to the moving guide section. In addition, since the rails regulate the movement of the main body section in directions except for a direction in which the rails extend, it is possible to improve the fitting accuracy of the connectors and the external connectors.

In addition, the connector housing apparatus is an integral type, in which the moving guide section is assembled so as not to be detached from the main body section, or a separation type, in which the main body section and the moving guide section are separated from each other. The connector housing apparatus, when the connector housing apparatus is the integral type, incorporates a part of the moving guide section into the inside of the main body section in a state in which the rails engage with each other, prevents the main body section from being detached by the part of the moving guide section incorporated into the inside of the main body section coming into contact with the inside of the main body section. The connector housing apparatus, when the connector housing apparatus is the separation type, connects the main body section to the moving guide section by engaging rails with each other after the latching section latches the moving guide section. Accordingly, even if the connector housing apparatus is the integral type, it is possible to prevent the main body section from being separated from the moving guide section. In addition, even if the connector housing apparatus is the separation type, it is possible to connect the main body section to the moving guide section only by fitting the rails, thus the operability for the user is improved.

This invention is not limited to the above-described embodiments but includes various modifications. The above-described embodiments are explained in details for better understanding of this invention and are not limited to those including all the configurations described above. A part of the configuration of one embodiment may be replaced with that of another embodiment; the configuration of one embodiment may be incorporated to the configuration of another embodiment. A part of the configuration of each embodiment may be added, deleted, or replaced by that of a different configuration. The above-described configurations, functions, and processors, for all or a part of them, may be implemented by hardware: for example, by designing an integrated circuit. The above-described configurations and functions may be implemented by software, which means that a processor interprets and executes programs providing the functions. The information of programs, tables, and files to implement the functions may be stored in a storage device such as a memory, a hard disk drive, or an SSD (Solid State Drive), or a storage medium such as an IC (Integrated Circuit) card, an SD card, or a DVD (Digital bersatile Disc). The drawings shows control lines and information lines as considered necessary for explanations but do not show all control lines or information lines in the products. It can be considered that almost of all components are actually interconnected.

What is claimed is:

1. A connector housing apparatus comprising:
   a main body section that has a plurality of connectors confronting a plurality of external connectors which an external housing has; and
   a moving guide section that guides movement of the main body section toward the external housing,
   wherein the moving guide section has a latching section that latches the moving guide section on the external housing,
   wherein the main body section is connected to the moving guide section so as to be movable in a fitting direction of the plurality of connectors in a state in which the moving guide section is latched on the external housing by the latching section,
   wherein the latching section latches the moving guide section on a position at which the plurality of connectors are fitted to the plurality of external connectors in a case where the main body section connected to the moving guide section moves along the moving guide section, and
   wherein the main body section moves along the moving guide section in the fitting direction of the plurality of connectors, and thereby the plurality of connectors are fitted to the plurality of external connectors, wherein respective a main-body-section movement surface, which is a surface of the main body section on which the moving guide section moves, and a moving-guide-section movement surface, which is a surface of the moving guide section on which the main body section moves, have rails which is extending toward the external housing side, wherein the rails are fitted to each other, wherein the rails regulate movement of the main body section in directions except for a direction in which the rails extend, and wherein the main body section is connected to the moving guide section by the rails being fitted to each other.

2. The connector housing apparatus according to claim 1, wherein the moving guide section has a moving-guide-section fixing portion that fixes, to the external housing, the moving guide section latched on the external housing by the latching section.

3. The connector housing apparatus according to claim 2, wherein the latching section is arranged closer to the external housing side than the moving-guide-section fixing portion, and
wherein after the moving guide section is latched on the external housing by the latching section, it comes to be possible to fix the moving guide section to the external housing by the moving-guide-section fixing portion.

4. The connector housing apparatus according to claim 3, wherein the main body section has a fitting surface on which the plurality of connectors are arranged and which confronts a surface of the external housing on which the plurality of external connectors are arranged,
wherein the moving-guide-section fixing portion has a moving-guide-section fixing screw and a moving-guide-section fixing surface, which is a surface parallel to the fitting surface of the main body section connected to the moving guide section,
wherein the moving-guide-section fixing surface has a hole,
wherein the hole communicates with a screw hole on the external housing in a case where the moving guide section is latched on the external housing by the latching section, and
wherein, by the moving-guide-section fixing screw being fastened through the hole to a screw hole communicating with the hole, the moving guide section is fixed to the external housing.

5. The connector housing apparatus according to claim 4, wherein the latching section is inserted into a latching-portion target hole on the external housing,
wherein the latching section inserted into the latching-portion target hole comes into contact with a surface on which the locking-portion target hole is, and thereby the latching section latches the moving guide section to the external housing, and
wherein a distance between the moving-guide-section fixing surface and the latching section is the thickness of the surface of the external housing which latches the latching section.

6. The connector housing apparatus according to claim 1, wherein an inserting-removing lever is turnably attached to the main body section,
wherein the inserting-removing lever has a claw portion protruding from a main-body-section movement surface, which is a surface of the main body section on which the moving guide section moves,
wherein a moving-guide-section movement surface, which is a surface of the moving guide section on which the main body section moves, has a notch, with which the claw portion, in a case where the main body section reaches a predetermined position of the moving guide section, protruding from a main-body-section movement surface engages, and
wherein, in a case where the claw portion engages with the notch, after the inserting-removing lever is turned, the main body section moves the moving guide section toward the external housing side, and the plurality of connectors are all completely fitted to the plurality of external connectors.

7. The connector housing apparatus according to claim 6, wherein the moving guide section has a moving-guide-section fixing portion that fixes the moving guide section to the external housing, and
wherein a distance between the latching section and the moving-guide-section movement surface on which the notch is arranged is less than a distance between the moving-guide-section movement surface and a position at which the moving-guide-section fixing portion fixes the moving guide section.

8. The connector housing apparatus according to claim 1, wherein the connector housing apparatus is an integral type, in which the moving guide section is assembled so as not to be detached from the main body section, or a separation type, in which the main body section and the moving guide section are separated from each other,
wherein, when the connector housing apparatus is the integral type, the connector housing apparatus:
incorporates a part of the moving guide section into the inside of the main body section in a state in which the rails engage with each other; and
prevents the main body section from being detached by the part of the moving guide section incorporated into inside the main body section coming into contact with the inside of the main body section, and
wherein, when the connector housing apparatus is the separation type, the connector housing apparatus connects the main body section to the moving guide section by engaging the rails with each other after the latching section latches the moving guide section.

9. An inter-connector connecting system comprising:
a first apparatus that houses a plurality of first connectors; and
a second apparatus having a plurality of second connectors that are fittable to the plurality of first connectors housed in the connector housing apparatus,
wherein the first apparatus includes:
a main body section that houses the plurality of first connectors;
a moving guide section that guides movement of the main body section toward the second apparatus;
wherein the moving guide section has a latching section that latches the moving guide section on the housing of the apparatus;
wherein a surface of the second apparatus on which the plurality of second connectors are arranged has a locking-portion target hole, into which the locking section is inserted,
wherein, after the latching section is inserted into the locking-portion target hole, the latching section latches the moving guide section on a housing of the second apparatus by the latching section inserted into the locking-portion target hole coming into contact with the surface in which the locking-portion target hole is formed,
wherein the main body section is connected to the moving guide section so as to be movable in a direction in which the plurality of first connectors are fitted to the plurality of second connectors in a state in which the moving guide section is latched on the housing of the second apparatus by the latching section, wherein the latching section latches the moving guide section on a position at which the plurality of first connectors are fitted to the plurality of second connectors in a case where the main body section connected to the moving guide section moves along the moving guide section, and wherein the main body section moves along the moving guide section in the fitting direction, and thereby the plurality of first connectors are fitted to the plurality of second connectors.

* * * * *